(12) United States Patent
Twieg

(10) Patent No.: US 7,081,751 B2
(45) Date of Patent: Jul. 25, 2006

(54) SYSTEMS AND METHODS FOR ESTIMATING PROPERTIES OF A SAMPLE

(75) Inventor: Donald Baker Twieg, Birmingham, AL (US)

(73) Assignee: The UAB Research Foundation, Birmingham, AL (US)

( * ) Notice: Subject to any disclaimer, the term of this patent is extended or adjusted under 35 U.S.C. 154(b) by 0 days.

(21) Appl. No.: 10/740,731

(22) Filed: Dec. 19, 2003

(65) Prior Publication Data

US 2004/0227512 A1 Nov. 18, 2004

Related U.S. Application Data

(60) Provisional application No. 60/437,301, filed on Dec. 31, 2002.

(51) Int. Cl.
*G01V 3/00* (2006.01)
*A61B 5/055* (2006.01)

(52) U.S. Cl. ............... 324/310; 324/307; 600/410

(58) Field of Classification Search ......... 324/309, 324/307, 308, 318, 306, 303; 600/410, 407
See application file for complete search history.

(56) References Cited

U.S. PATENT DOCUMENTS

| | | | |
|---|---|---|---|
| 4,021,726 A * | 5/1977 | Garroway et al. | 324/309 |
| 4,307,343 A | 12/1981 | Likes | 324/307 |
| RE32,712 E | 7/1988 | Likes | 324/307 |
| 5,387,865 A | 2/1995 | Jerosch-Herold et al. | 324/303 |
| 5,539,310 A * | 7/1996 | Basser et al. | 324/307 |
| 6,291,997 B1 * | 9/2001 | King et al. | 324/319 |
| 6,486,670 B1 * | 11/2002 | Heid | 324/307 |
| 6,603,989 B1 * | 8/2003 | Yablonskiy | 600/410 |
| 6,714,009 B1 * | 3/2004 | Heidler | 324/303 |
| 6,748,098 B1 * | 6/2004 | Rosenfeld | 382/131 |
| 6,937,014 B1 * | 8/2005 | Sun et al. | 324/303 |
| 6,977,500 B1 * | 12/2005 | Hrovat et al. | 324/309 |
| 2003/0160612 A1 * | 8/2003 | Yablonskiy et al. | 324/309 |
| 2003/0214286 A1 * | 11/2003 | Heidler | 324/303 |
| 2003/0215154 A1 | 11/2003 | Pauly et al. | 382/254 |
| 2004/0136608 A1 * | 7/2004 | Rosenfeld | 382/276 |
| 2004/0227512 A1 * | 11/2004 | Twieg | 324/309 |

FOREIGN PATENT DOCUMENTS

WO     WO 2004061419 A2 * 7/2004

OTHER PUBLICATIONS

Ozturk, et al.; Image enhancement in single-shot direct parametric imaging (SSDPI), Biomedical Engineering Society, Meeting Abstracts; Raleigh-Duram, NC, Oct. 2001.

(Continued)

*Primary Examiner*—Diego Gutierrez
*Assistant Examiner*—Tiffany A. Fetzner
(74) *Attorney, Agent, or Firm*—Thomas, Kayden, Horstemeyer & Risley

(57) ABSTRACT

Systems and methods for estimating properties of a sample are provided in which, for some embodiments, each datum of a set of data is modeled using a parameterized equation. The parameterized equation has multiple parameters, where each parameter represents a property of the subject. The parameterized equation is inverted, and the inverted parameterized equation provides an indication of one or more properties associated with the subject.

22 Claims, 29 Drawing Sheets

OTHER PUBLICATIONS

Ozturk, et al.; Imaging of the Brain via single shot direct parametric imaging (SSDPI), Biomedical Engineering SOciety, Meeting Abstracts; Raleigh-Durham, NC, Oct. 2001.

Tweig, DB; A New Approach for fMRI Acquisiton, Joint EMBS-BMES meeting, Mini-symposium on fMRI (Invited), Houston, Texas, Oct. 2002.

Twieg, D.B.; IMaging Relaxation and Frequency Directly from a Single-Shot Signal,International Society for Magnetic Resonance in Medicine, Meeting Abstracts, Toronto, Jul. 2003.

Twieg, D.B.; Parsing local signal evolution directly from a single-shot MRI signal; a new approzch for fMRI, Magn Reson Med 50, 1043-1052, 2003.

* cited by examiner

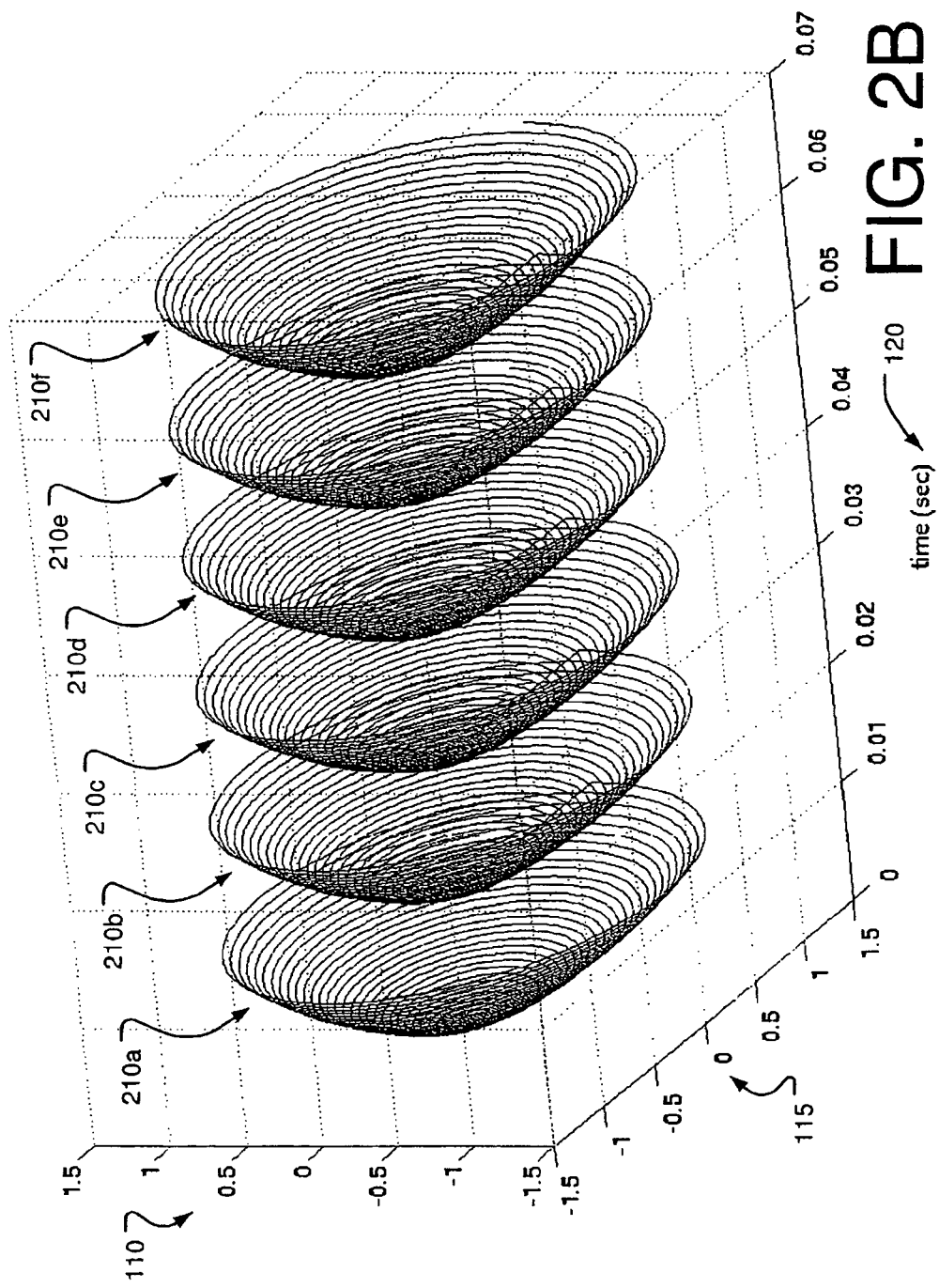

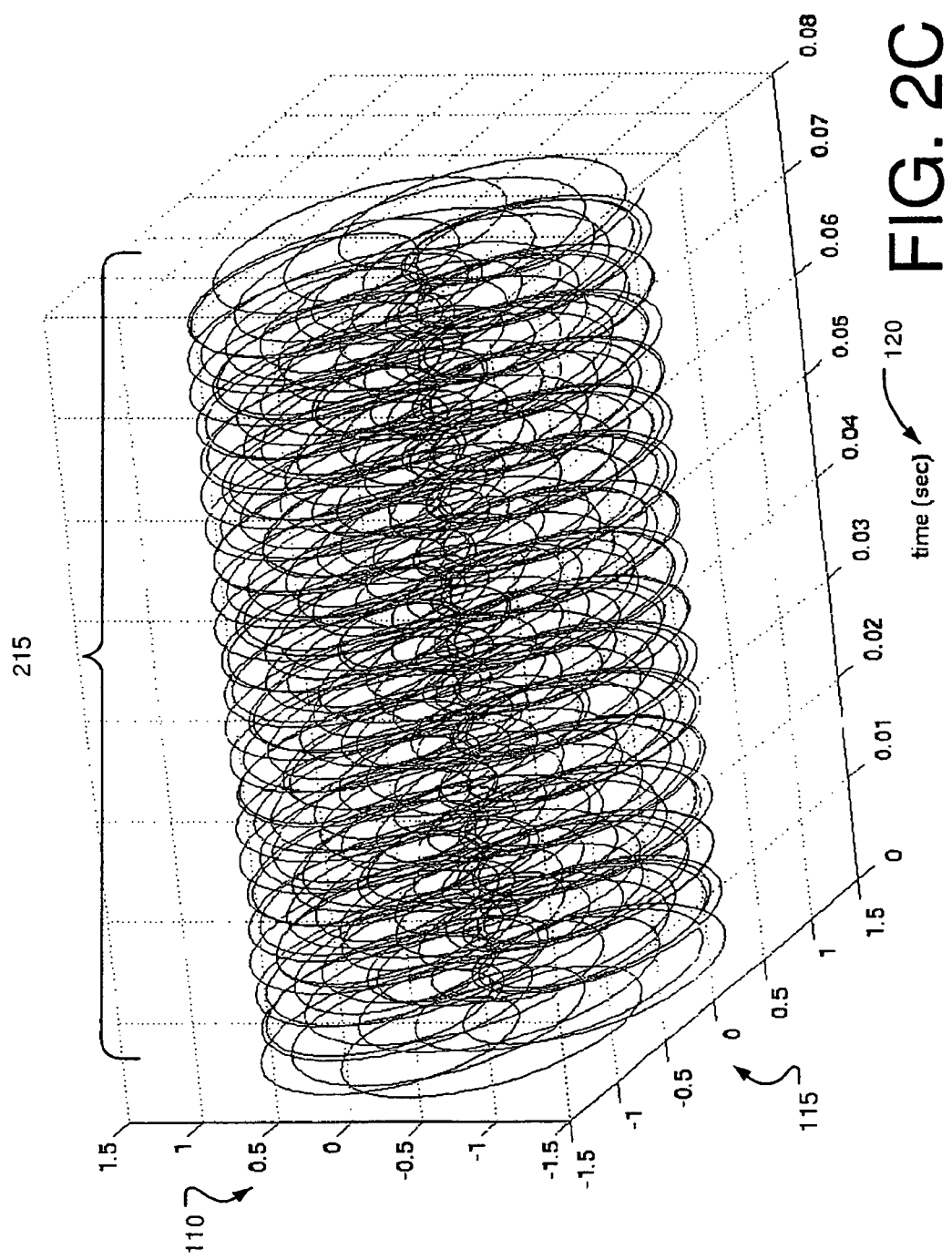

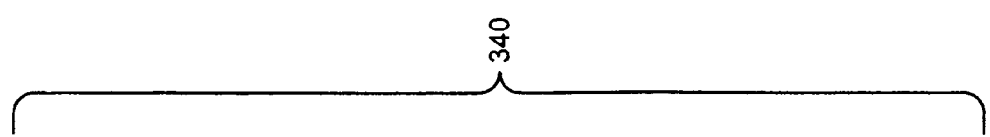
FIG. 3C

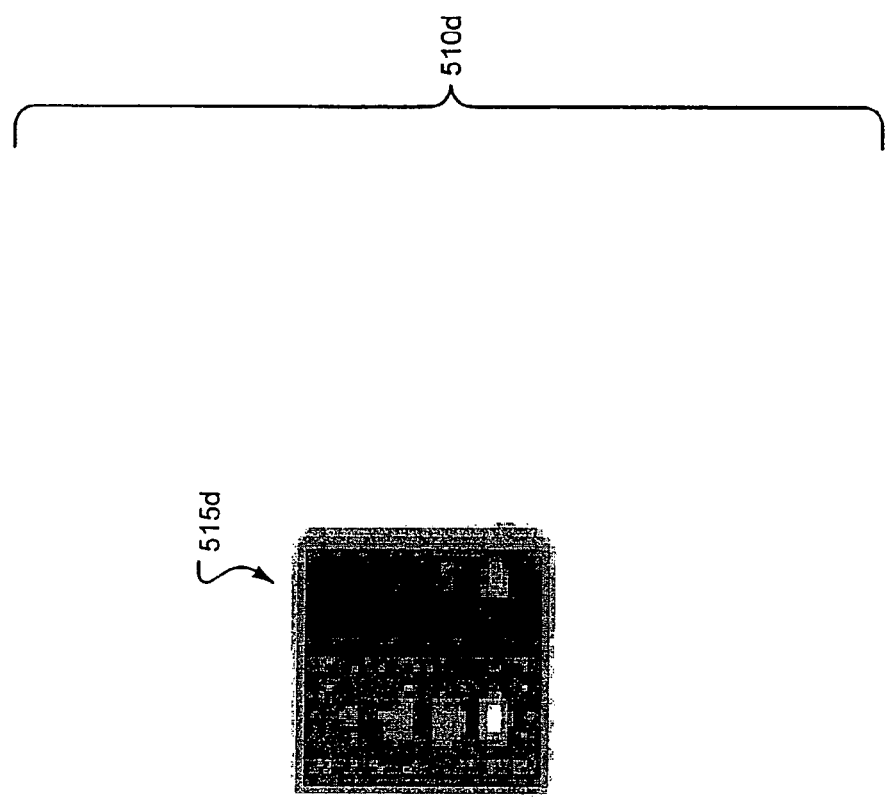

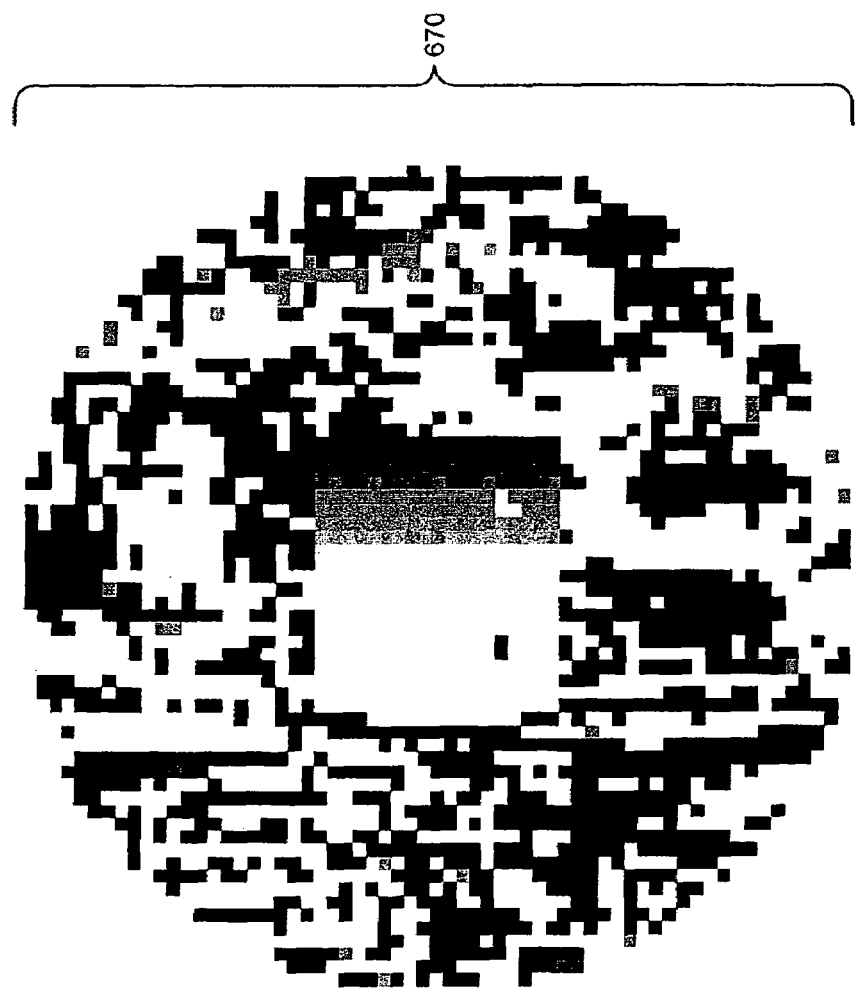

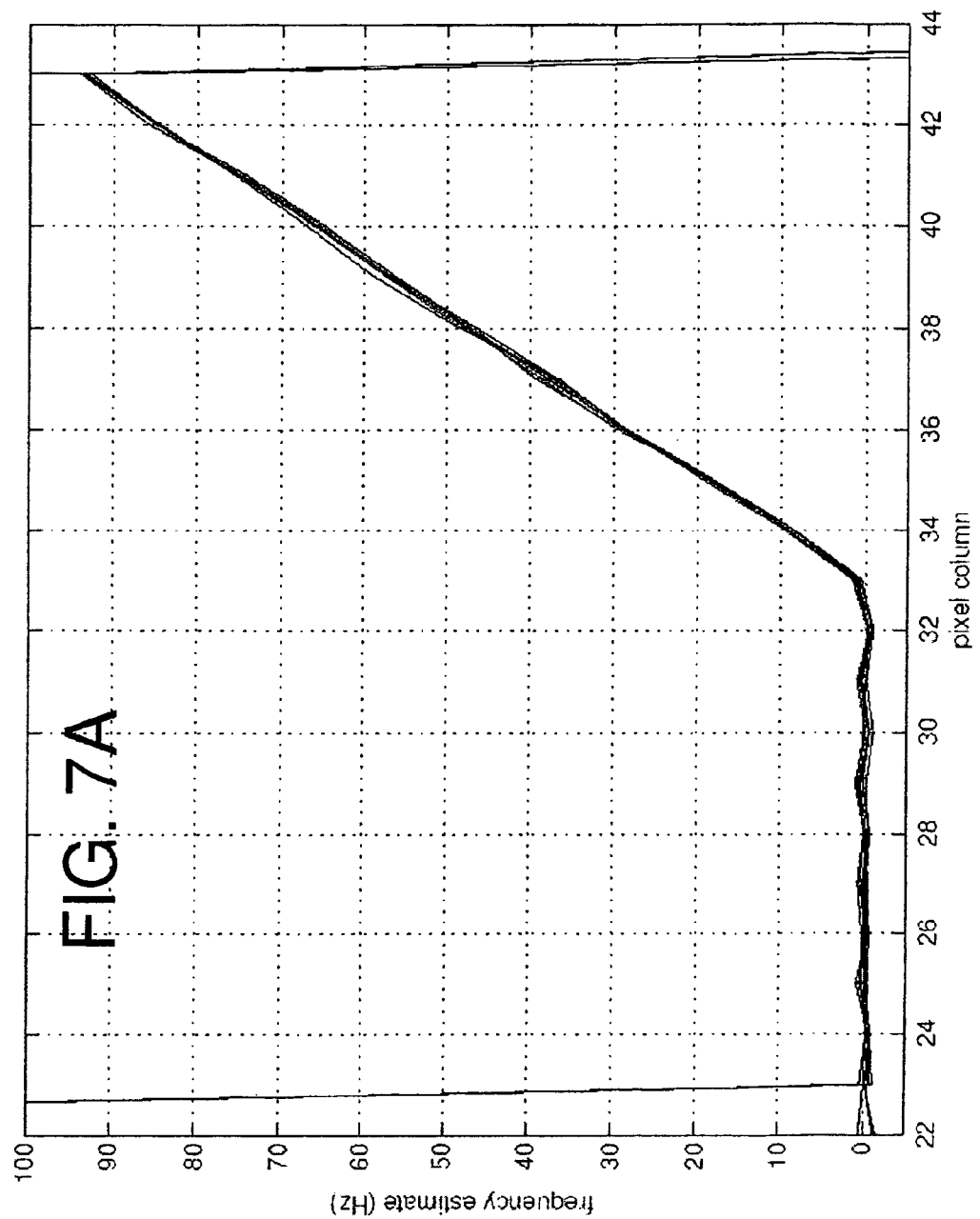

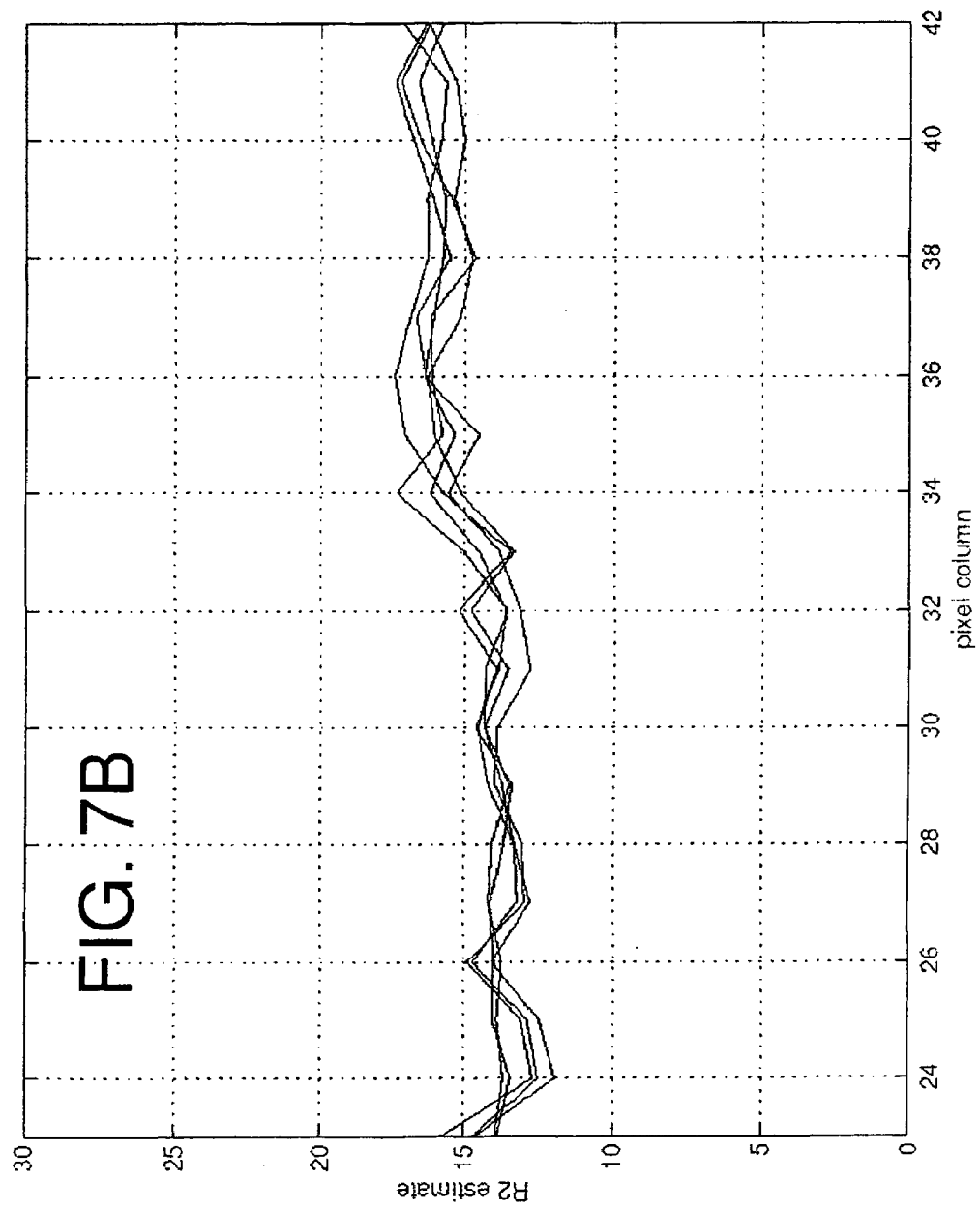

| Method | Gmax (g/cm) | Smax (g/cm-sec) | Ta (msec) | frames | Total data points | Ttotal (msec) |
|---|---|---|---|---|---|---|
| EPI | 5.0 | 49,131 | 21.4 | 4 | 16,384 | 85.6 |
|  | 3.25 | 49,064 | 21.2 | 4 | 16,384 | 84.8 |
| Spiral | 5.0 | 27,228 | 10.6 | 6 | 22,248 | 63.6 |
|  | 3.25 | 17,698 | 11.2 | 6 | 22,248 | 67.2 |
| SS-PARSE | 3.25 | 49,657 | -- | -- | 14,000 | 42.2 |

FIG. 10

SYSTEMS AND METHODS FOR ESTIMATING PROPERTIES OF A SAMPLE

CROSS REFERENCE TO RELATED APPLICATIONS

This application claims the benefit of U.S. provisional patent application Ser. No. 60/437,301, filed on Dec. 31, 2002, having the title "Single Excitation Magnetic Resonance Imaging (MRI) Method and Device," which is incorporated herein by reference in its entirety.

STATEMENT REGARDING FEDERALLY SPONSORED RESEARCH

This work was funded, at least in part, by grant RR11811 from the National Institutes of Health (NIH), National Center for Research Resources. Accordingly, the U.S. Government may have certain rights to the invention.

FIELD OF THE INVENTION

The present disclosure relates generally to data analysis and, more particularly, to systems and methods for estimating properties of a sample.

BACKGROUND

Various systems acquire data from samples and process the acquired data in order to estimate properties related to the samples. The accuracy of the estimated properties depends on the signal-to-noise ratio (SNR) of the system, the data acquisition method, and a multitude of other factors.

In magnetic resonance imaging (MRI), a sample is placed in an MRI scanner. As is known, the MRI scanner "excites" spins in the sample to a higher energy level, and subsequently detects the "relaxation" of the spins to an equilibrium condition. The behavior of the spins depends on various properties related to the sample. Hence, by observing the relaxation behavior of the spins in the sample, one can estimate various properties associated with the sample.

MRI has been used to perform functional magnetic resonance imaging (fMRI), which detects brain activity in response to one or more external stimuli. Specifically, fMRI detects changes in spin behavior for various portions of the brain, as those portions are "activated" in response to one or more stimuli. These changes are often subtle and can be affected by a myriad of factors, such as magnetic field inhomogeneities, field strength, and motion artifacts. Due to the relative difficulty in detecting such subtle changes, there is an ongoing need for improved systems and methods to estimate properties of samples.

SUMMARY

The present disclosure provides systems and methods for estimating properties of a sample.

Briefly described, in some embodiments, a subject or system is modeled using a parameterized equation. The parameterized equation has multiple parameters, with each parameter representing a property of the subject. The parameterized equation is inverted, and the inverted parameterized equation provides an indication of one or more properties associated with the subject.

Other systems, devices, methods, features, and advantages will be or become apparent to one with skill in the art upon examination of the following drawings and detailed description. It is intended that all such additional systems, methods, features, and advantages be included within this description, be within the scope of this disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2B is a diagram illustrating a spiral k-space trajectory for acquisition of MGE MRI data.

FIG. 2C is a diagram illustrating a rosette k-space trajectory for acquisition of MRI data.

FIG. 3C is a diagram illustrating the same cross section of FIG. 3B computed using a parameterized approach, which does not exhibit ghosting in the background.

FIGS. 5A through 5F are images using a spiral k-space trajectory for different echo times.

FIG. 6E is an image of an estimate of the frequency of the parameterized equation, given by an iterative estimation algorithm.

FIG. 7A is a chart showing fitted frequencies across several rows of a phantom.

FIG. 7B is a chart showing fitted relaxation rate estimates for the same locations of FIG. 7A.

FIG. 10 shows a table of example gradient performance and acquisition times for various k-space trajectories.

DETAILED DESCRIPTION OF THE EMBODIMENTS

Figure 1A:
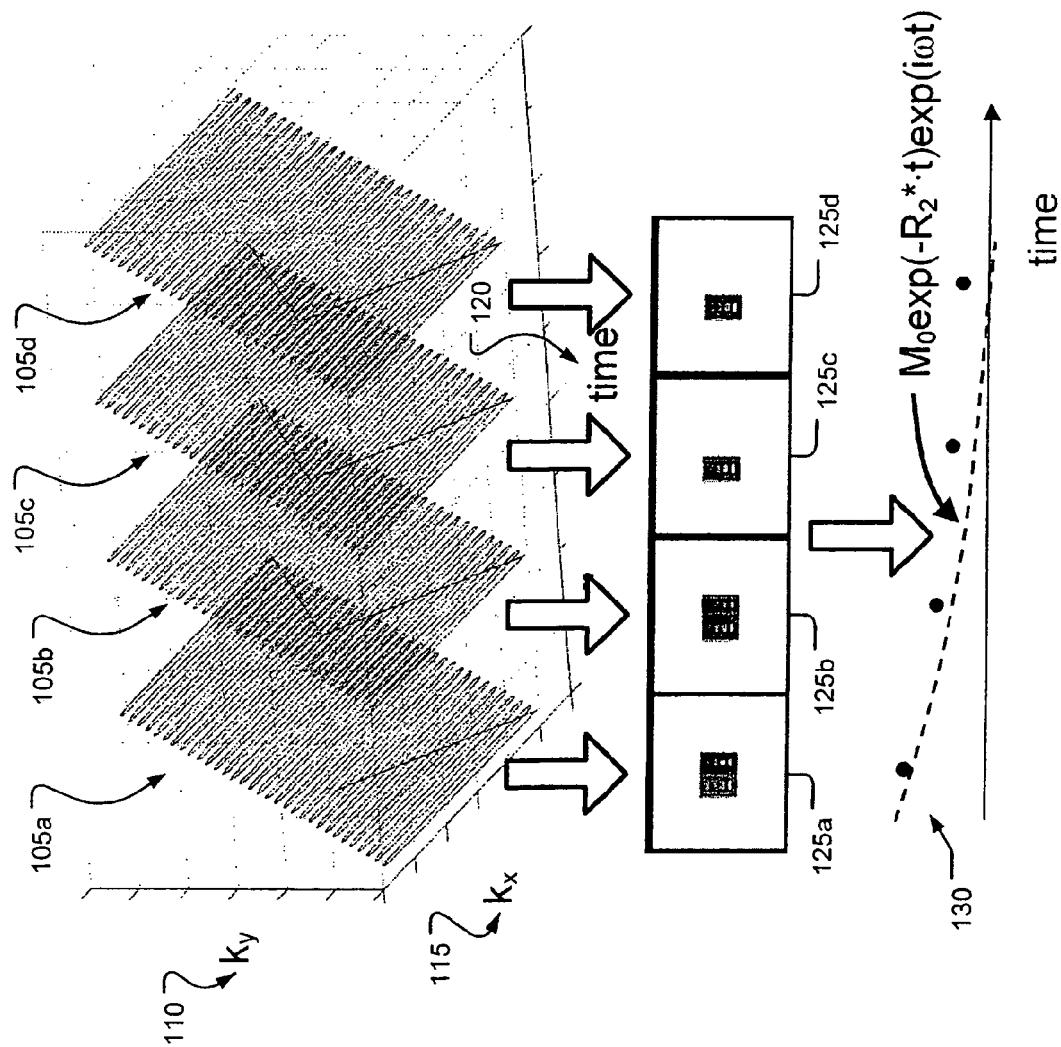
FIG. 1A is a diagram illustrating a conventional approach to analyzing data.

Reference is now made in detail to the description of the embodiments as illustrated in the drawings. While several embodiments are described in connection with these drawings, there is no intent to limit the invention to the embodiment or embodiments disclosed herein. On the contrary, the intent is to cover all alternatives, modifications, and equivalents.

Nuclear magnetic resonance (NMR) has been used to perform functional magnetic resonance imaging (fMRI), which detects brain activity in response to one or more external stimuli. The brain activity is often subtle and can be obscured by other events that also produce subtle changes in the NMR signal. Due to the relative difficulty in detecting such subtle changes, there is an ongoing need for improved systems and methods to estimate properties of a sample.

In conventional approaches, images are reconstructed from the raw data and, thereafter, a pixel-by-pixel curve-fitting algorithm is performed on the reconstructed images. Thus, conventional approaches do not provide a "global" view of the entire data set. Rather, conventional approaches isolate individual images, and perform a fit across the isolated images. In other words, conventional approaches perform a piece-meal analysis of the data. Furthermore, conventional approaches cannot identify those signal changes which inevitably occur because the object being imaged is changing while the signal data are being obtained. Thus, conventional approaches are more susceptible to artifactual errors, and cannot make use of possibly valuable information on the changing, dynamic nature of the object which may be present in the signal.

Embodiments of this disclosure include collecting and processing data using a multi-dimensional parameterized approach, which analyzes the collected data as a single large set of individually distinct signal samples, rather than performing a piece-meal analysis of the data. For example, in magnetic resonance imaging (MRI), a multi-dimensional data-fitting algorithm is performed on the raw data set (or the data set prior to Fourier transform) without first reconstructing intermediate images. Since the multi-dimensional data-fitting algorithm analyzes the raw data as a whole without reconstructing intermediate images, artifactual errors that exist in conventional approaches can be reduced. In addition, embodiments of the multi-dimensional parameterized approach include an iterative algorithm that converges to within a predefined limit.

An example of such a multi-dimensional parameterized approach is described in "Parsing Local Signal Evolution Directly From a Single-Shot MRI Signal: A New Approach to fMRI," authored by Dr. Donald B. Twieg, and peer-review published in 2003, on pages 1043 through 1052 of volume 50 of Magnetic Resonance in Medicine (hereinafter abbreviated as "Magn. Reson. Med 50:1043–1052 (2003)"). That article is incorporated herein by reference as if set forth in its entirety.

Having generally described an approach for estimating sample properties, specific examples are provided in the context of NMR and, more specifically, in the context of fMRI. Since those having skill in the art are familiar with NMR, only an abridged discussion of NMR is provided in order to illustrate exemplary embodiments.

As is known, every nucleus has an inherent property known as a nuclear spin. Those nuclei having unpaired spins are observable using NMR. When a sample is placed in a static magnetic field, NMR-observable nuclei align either parallel or anti-parallel to the static magnetic field. The numbers of parallel and anti-parallel nuclei are determined by the strength of the static magnetic field. Since the detectable NMR signal is a function of the net difference between the parallel and anti-parallel nuclei, the signal strength in NMR is proportional to the strength of the static magnetic field.

In accordance with classical quantum mechanics, nuclei can occupy only discrete or quantized energy levels. The quantized energy levels of the nuclei imply that the orientations of the angular moment are also quantized. Due to this quantum-mechanical limitation, the alignment of the nuclei with the static magnetic field is not perfect, but at an angle that is governed by the quantum-mechanical limitations.

Due to the angled alignment with the magnetic field, each individual nucleus (commonly referred to as a "spin") experiences a torque from the magnetic field. That torque causes the spins to precess at a rate that is proportional to the strength of the magnetic field. This precessional rate is commonly referred to as the Larmor frequency. Given that the field strength is proportional to the precessional rate of the nucleus, it should be appreciated that judicious adjustment of the magnetic field strength will result in a corresponding change in the precessional rate. Magnetic resonance imaging (MRI) acquires spatially localized data by exploiting the field-strength dependent precessional rates.

Also due to their angled alignment, the aggregate of spins (commonly referred to as "net magnetization," "net magnetization vector," or simply "magnetization") has both a longitudinal component, which is along the axis of the magnetic field, and a transverse component, which is perpendicular to axis of the magnetic field.

Once the spins have aligned with the static magnetic field, the spins can be "excited" into the transverse plane by depositing energy to the spins. The energy is typically deposited by a radio-frequency (RF) pulse at the Larmor frequency. Once excited into the transverse plane, the magnetization "relaxes" back to its original alignment. The relaxation exhibits itself as a decay in the signal.

Since the magnetization has both a longitudinal component and a transverse component, the relaxation is characterized by both longitudinal relaxation time constants and transverse relaxation time constants. Of particular interest in fMRI is a transverse time constant, $T_2^*$, or its inverse:

$$R_2^* = \frac{1}{T_2^*}, \quad [\text{Eq. 1}]$$

which are indicative of the signal decay. The behavior of the transverse magnetization can be modeled according to Eq. 2, which is a solution to an equation commonly referred to as the "Bloch equation," after Dr. Felix Bloch:

$$M_{xy} = M_{xy,0} e^{-(R_2^* + i\omega)t} \quad [\text{Eq. 2}],$$

where $M_{xy}$ is the observed signal intensity at time t, and $M_{xy,0}$ is the initial amplitude of the signal following the RF excitation pulse.

When spatial-encoding magnetic field gradients are applied for MRI, the gradients affect the signal such that the signal contribution ds(x, t) within a pixel volume dx at location x can be modeled according to:

$$ds(x,t) = M_{xy,0} e^{-(R_2^*(x) + i\omega(x))t_n} e^{-2\pi i k_n x} dx \quad [\text{Eq. 3}],$$

and the observed signal $s(t_n)$ during the imaging procedure is the integral over space:

$$s(t_n) = \int\int M_{xy0} e^{-(R_2^*(x)+i\omega(x))t_n} e^{-2\pi i k_n \cdot x} dx \qquad [\text{Eq. 4}],$$

where $\omega(x)$ is the local frequency; $R_2^*(x)$ is the local net relaxation rate; and $e^{-2\pi i k_n \cdot x}$ is the spatial phase modulation imposed by the imaging gradients at time $t_n$.

The discrete version of this equation relates the observed sampled signal values $s_n$ to the discrete arrays $M_{xy0}$, $R_2^*$, and $\omega$ on the spatial (x, y) grid indexed by q and r such that:

$$s_n = \sum_q \sum_r M_{xy0}(q,r) e^{-(R_2^*(q,r)+i\omega(q,r))n\Delta t} e^{-2\pi i k_n \cdot x_{qr}}, \qquad [\text{Eq. 5}]$$

where the nth measurement represents the inner product of the object distribution at time $t_n$ with the nth spatial "basis function" of $e^{-2\pi i k_n \cdot x}$. For simplification, if $g(q,r)$ is substituted for $e^{-(R_2^*(q,r)+i\omega(q,r))\Delta t}$, and $\psi_n(q,r)$ is substituted for $e^{-2\pi i k_n \cdot x_{qr}}$, then Eq. 5 can be rewritten as:

$$s_n = \sum_q \sum_r M_{xy0}(q,r) g(q,r)^n \psi_n(q,r). \qquad [\text{Eq. 6}]$$

Inversion of Eq. 6 results in the determination of the two complex-valued spatial functions $M_{xy0}$ and g, with fewer processing steps than conventional approaches. Unlike conventional approaches, the inversion of Eq. 6 results in a more robust estimation of $M_{xy0}$ and $R_2^*$.

Another advantage provided by such an approach is that fewer data points are needed to obtain results that are comparable to those obtained using conventional approaches. For example, in conventional MRI, each image is acquired in distinct data segments. Thus, the time interval required for the acquisition of each data segment serves as a temporal limit on the data acquisition. Unlike conventional approaches, the data can be acquired, in some embodiments, in a shorter time frame by taking advantage of a shorter temporal sampling interval such as, for example, that found in a rosette trajectory or other comparable periodic waveforms. Additionally, unlike conventional approaches, the disclosed embodiments provide flexibility in accommodating multiple parameterized dependencies within the same data set.

Having broadly described the inventive concepts, a specific embodiment, hereinafter referred to as Parameter Assessment by Retrieval from Signal Encoding (PARSE) is discussed below. Specifically, a particular species of PARSE, namely, single-shot PARSE (SS-PARSE), is provided in the context of fMRI in order to more clearly describe various aspects of this disclosure. It should, however, be appreciated that the description below is not intended to limit the scope of this disclosure to PARSE, to SS-PARSE, or to fMRI. Rather, the description below is provided solely for the purposes of illustration.

Figure 1B:
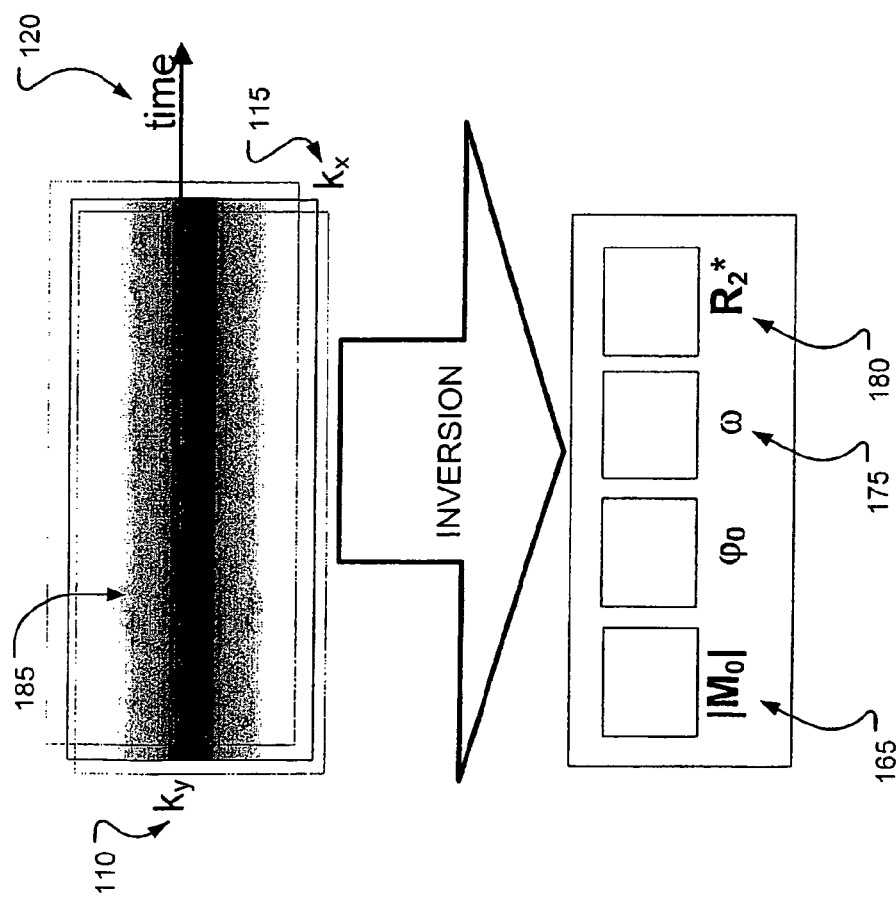
FIG. 1B is a diagram illustrating a parameterized approach to analyzing data, in accordance with an embodiment of the invention.

Specifically, FIGS. 1A and 1B provide a schematic summary of the differences between conventional approaches and the PARSE approach presented in detail below. FIG. 1A is a schematic representation of a multiple-gradient-echo (MGE) to measuring local signal parameters from a single-shot signal. As shown in FIG. 1A, the two-dimensional k-space raster is shown as ky 110 and kx 115, with the time axis 120 shown in the third dimension. The MGE approach acquires data 105a ... 105d (collectively referred to as 105) for multiple (4 in this case) images sequentially. Each image frame 125a ... 125d (collectively referred to as 125) is reconstructed as though its data were acquired instantaneously at time TEj for j=1 to j=4. Local $M_{xy0}$, $R_2^*$, and frequency at a given pixel can be computed by fitting an exponential 130 to the corresponding pixel values in each image.

FIG. 1B is a schematic representation of the PARSE technique, where $M_{xy0}$ 165, $R_2^*$ 180, and frequency 175 are directly computed from a set of data 185 in (k,t)-space 110,115, 120 without forming intermediate images.

A specific form of SS-PARSE investigated here uses a rosette k-trajectory (see FIG. 2C). It has been shown that (k,t)-trajectories which sample frequently near the k-origin, such as the rosette and appropriate stochastic trajectories, produce upon Fourier inversion an accurate spatial representation for portions of the object which are on or nearly on resonance, while off-resonance portions of the object are blurred into a low-intensity and spatially dispersed aliasing pattern. When data are processed by two-dimensional (2D) discrete Fourier transform (DFT) in the spatial domain, these methods essentially create a restricted depth of focus in frequency, analogous to the intentionally restricted depth of focus in confocal microscopic and X-ray planar tomographic techniques. By multiplying the raw data signal by a desired offset frequency before DFT, reconstruction may be made selective for frequencies near the specified offset frequency.

The rosette's increased density of sampling near the origin (once per millisecond or so in this implementation) corresponds to a much higher effective sampling bandwidth than those of the conventional multiple-gradient echo (MGE) methods. Furthermore, a large portion of an extended object's energy is typically distributed near the k-space origin, suggesting that the frequent sampling of this large-magnitude signal by the rosette might be a more signal-to-noise-effective means of measuring local evolution and decay rates, leading to more accurate estimates of these local parameters than can be provided by MGE methods with the same gradient system constraints. The results below are consistent with this suggestion.

To assess the ability of the SS-PARSE, single-shot echo planar imaging (EPI), and spiral methods to produce useful images and estimates of $R_2^*$ and frequency, under off-resonance conditions and in substantial background gradients comparable to susceptibility gradients found in vivo, acquisition of image data from a test object was simulated. The test object is a 7-cm by 8-cm rectangle in a 24-cm field of view (FOV). The left-hand 7-cm by 4-cm half of the rectangle is uniform and on-resonance, and has a relaxation rate of 15 sec$^{-1}$. It includes a set of four small rectangular features with intensity 0%, 50%, 75%, and 90% of the intensity of the rest of the rectangle. The right half of the rectangle is substantially identical except its local frequency increases linearly from 0 at the center to 100 Hz at the right edge, 4 cm from the rectangle center. Simulated data were computed from analytic expressions for the test object in (k,t)-space, rather than from a discretized spatial model of the object, which could lead to errors, especially in regions of large frequency gradients. Normally-distributed independent noise was added to the simulated signals with the same amplitude for each acquisition type, and bandwidth corresponding to the appropriate sampling rate. Two noise amplitudes were used. In the low-noise condition, signal-to-noise ratio (SNR) was about 100:1 in the first 64-by-64 EPI image in the on-resonance section of the test object, and in the high-noise condition, SNR was about 43:1.

Figure 2A:
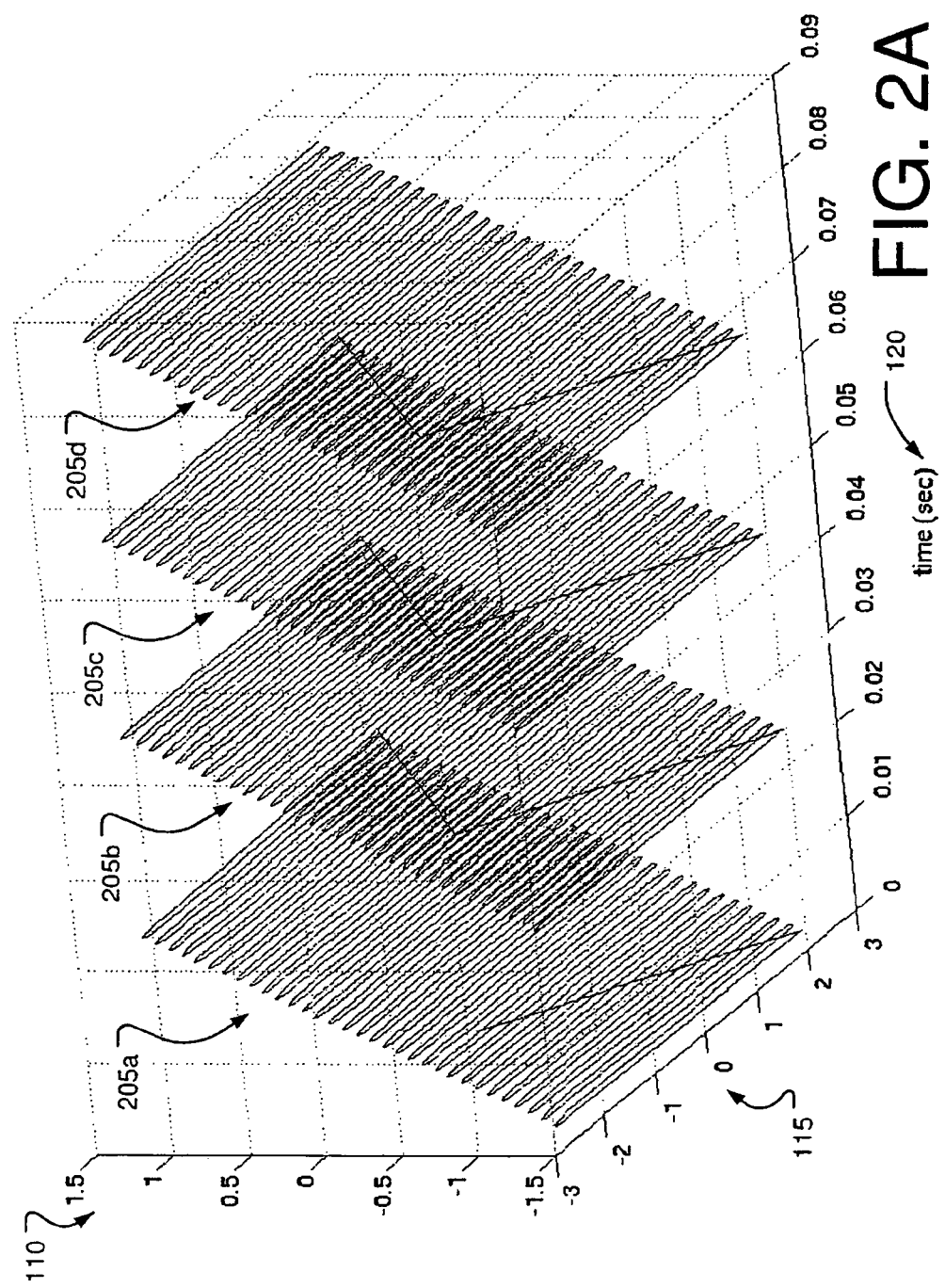
FIG. 2A is a diagram illustrating a saw-tooth echo-planar-imaging (EPI) k-space trajectory for acquisition of multiple-gradient-echo (MGE) magnetic resonance imaging (MRI) data.

Gradient waveforms were computed for gradient-echo (GE) echo-planar imaging (EPI), spiral, and rosette acquisitions, with 64-by-64 array size in a 24-cm FOV, suitable for a gradient system with 5-g/cm maximum gradient amplitude and a 100 microsecond rise time. These values were chosen as representative of contemporary head-only gradient hardware, which might be used in fMRI studies. EPI waveforms were trapezoidal with blipped phase-encode gradients and linear phase-encoding order, and spiral waveforms were computed using the algorithm of Glover, described in Magn. Reson. Med., 1999; 42:412–415, having the title "Simple analytical spiral k-space algorithm." The resulting k-trajectories are shown in FIGS. 2A through 2C. Specifically, FIG. 2A shows the (k,t)-trajectory 205a . . . 205d (collectively 205) for a four-gradient-echo EPI acquisition; FIG. 2B shows the (k,t)-trajectory 210a . . . 210f (collectively 210) for a six-gradient-echo single-shot spiral acquisition; and FIG. 2C shows the (k,t)-trajectory 215 for the rosette used during the SS-PARSE experiment described herein.

Acquisition times for individual frames, and actual maximum gradient amplitudes and slew rates are shown for EPI, spiral and SS-PARSE in the table of FIG. 10. Assuming that parenchymal brain signals will have undergone significant dephasing by that time, the maximum useful duration of acquisition for SS-PARSE was chosen to be 75 milliseconds, and the number of echoes in the multiple-frame EPI and spiral acquisitions were chosen to have roughly the same total acquisition duration.

EPI image reconstructions were performed by simple 2D inverse fast Fourier transform (IFFT). Because the simulation assumed accurate sample values from k-space grid locations without the phase shift effects expected in experimental data, there was no phase compensation. Spiral reconstructions were performed by inverse DFT with sampling density compensation, as described by Hoge, et al. in Magn. Reson. Med, 1997; 38:117–128, having the title "Density compensation functions for spiral MRI." For noiseless data, both EPI and spiral reconstructions produced artifact-free renditions of on-resonance objects, thereby verifying that the reconstruction procedures used were appropriate and did not introduce errors peculiar to the simulation process.

The inverse problem for SS-PARSE, as provided in Eq. 6, is nonlinear, but could be solved by any of a number of algorithms, as suggested by Bertero, et al. in "Introduction to inverse problems in imaging," published in 1998 by Bristol and Philadelphia: Institute of Physics Publishing. In the disclosed study, the algorithm used for reconstruction of the parameterized images ($M_{xy0}$, frequency, and relaxation rate) took the following form.

First, an estimated signal, $s_{est}$ was computed for each spatial location x(q,r) by pre-multiplying the measured signal $s_0(n)$ by the complex conjugate of the modulation due to the imaging gradients, i.e., $s_{est}(x(q,r),n)=s_0(n)\exp(i2\pi k(n)\cdot x(q,r))$. Next, an estimated temporal spectrum was computed for each location, i.e., $S_{est}(\omega)=DFT\{s_{est}(x(q,r),)\}$. Thereafter, a Lorentzian fit was performed on the low-frequency band (±380 Hz) of each local spectrum to provide initial estimates of local M, $\omega$ and $R_2^*$. Finally, using this Lorentzian fit as a starting point, an iterative search algorithm was employed, adjusting the local M, $\omega$ and $R_2^*$ estimates so as to minimize the least-squares difference between the observed signal $s_0(n)$ and the estimated signal given by placing the M, $\omega$ and $R_2^*$ estimates into the model given by Eq. 5.

A simple steepest descent algorithm was used, searching by golden section line-search alternately along the steepest gradient in the ($M_x+iM_y$) directions and then along the steepest gradient in the ($R_2^*+i\omega$) directions. While convergence was contingent on good starting values, in practice, the estimates provided by the initial Lorentzian fit worked well as starting values.

To test the consistency of $R_2^*$ estimation by means of the MGE methods and the SS-PARSE approach, a series of 8 simulated acquisitions for each method was performed under two signal-to-noise conditions. For a set of pixels in the on-resonance left-hand box, and a set of pixels in the right-hand box with background gradient, the mean and standard deviation of the $R_2^*$ estimates were computed across the eight acquisitions. Pixels within the small contrast bars were excluded from this analysis. For the multiple-echo EPI acquisitions, $R_2^*$ estimates were computed using 2, 3, and 4 echoes, and for spiral acquisitions, $R_2^*$ estimates were computed using 2, 3, 4, 5, and 6 echoes.

As noted above, FIGS. 2A through 2C illustrate the differences in distribution of samples in (k,t)-space for the multiple-echo EPI (FIG. 1A), spiral (FIG. 1B), and SS-PARSE (FIG. 1C).

Figure 3A:
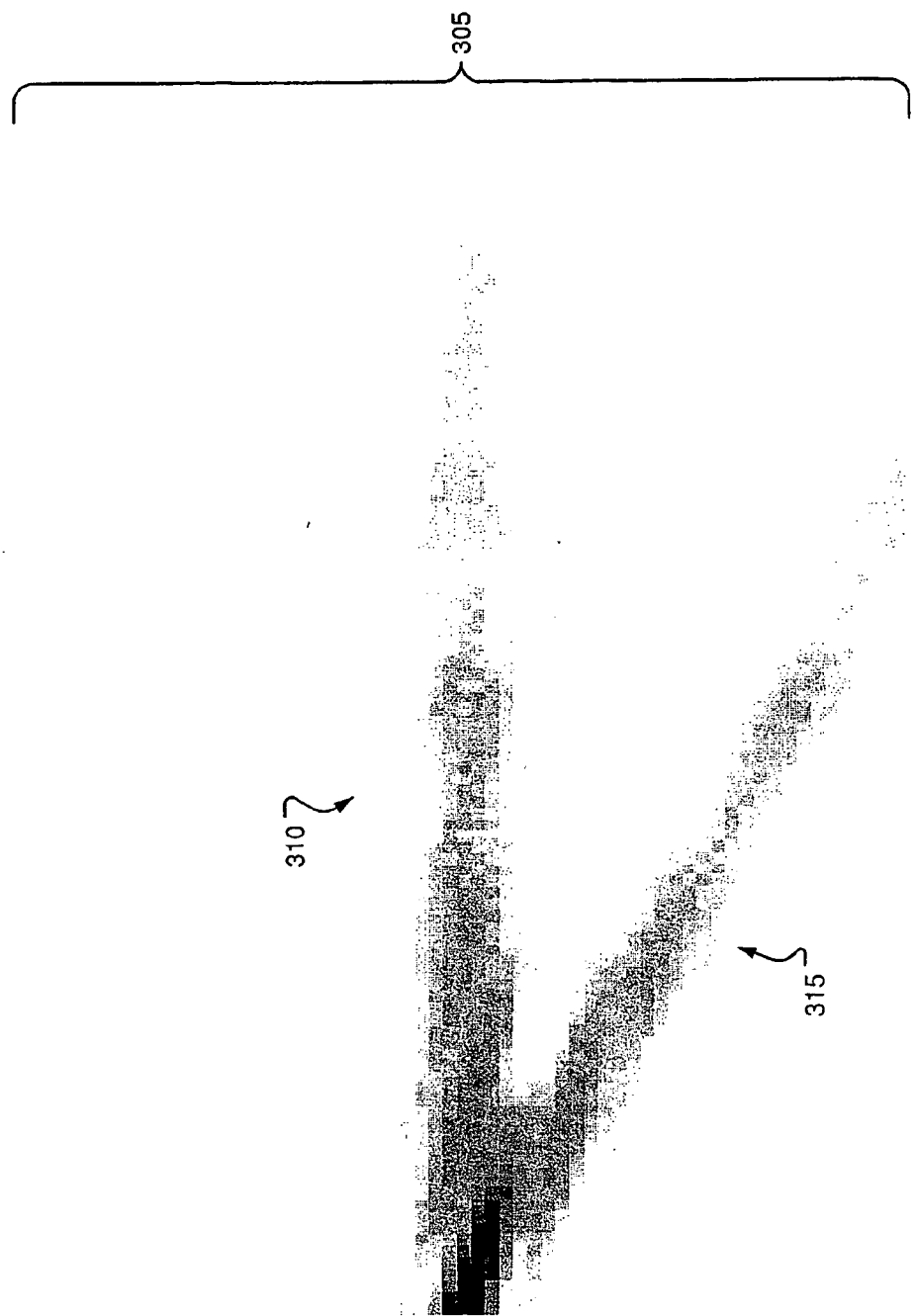
FIG. 3A is a diagram illustrating a (k,t)-space distribution for a phantom.
Figure 3B:
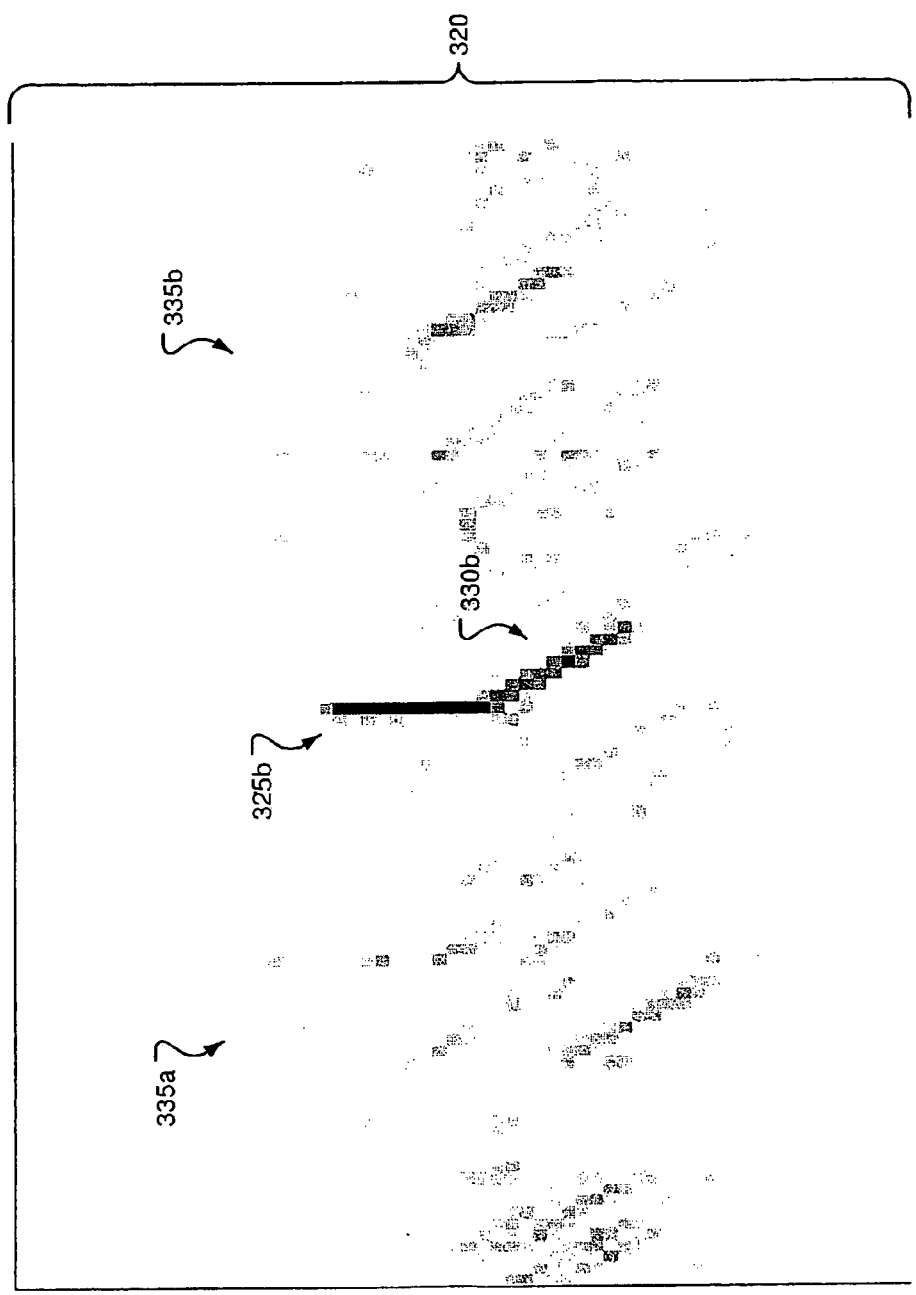
FIG. 3B is a diagram illustrating the computed discrete Fourier transform (DFT) of FIG. 3A, which exhibits ghosting in the background.
Figure 4A:
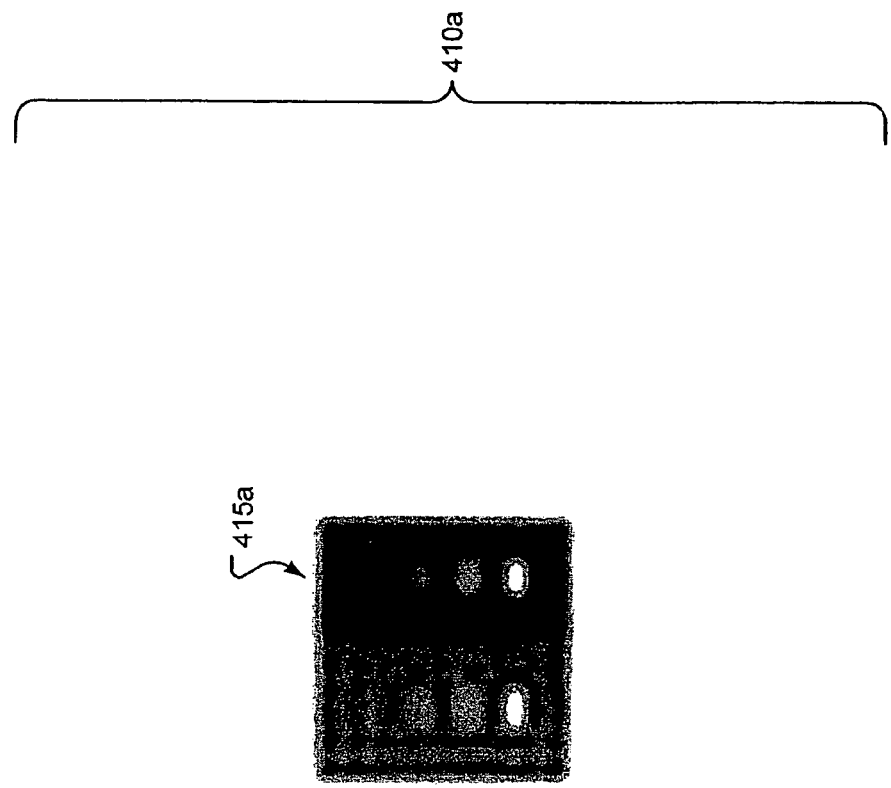
FIGS. 4A through 4D are images acquired using an EPI k-space trajectory for different echo times.
Figure 4B:
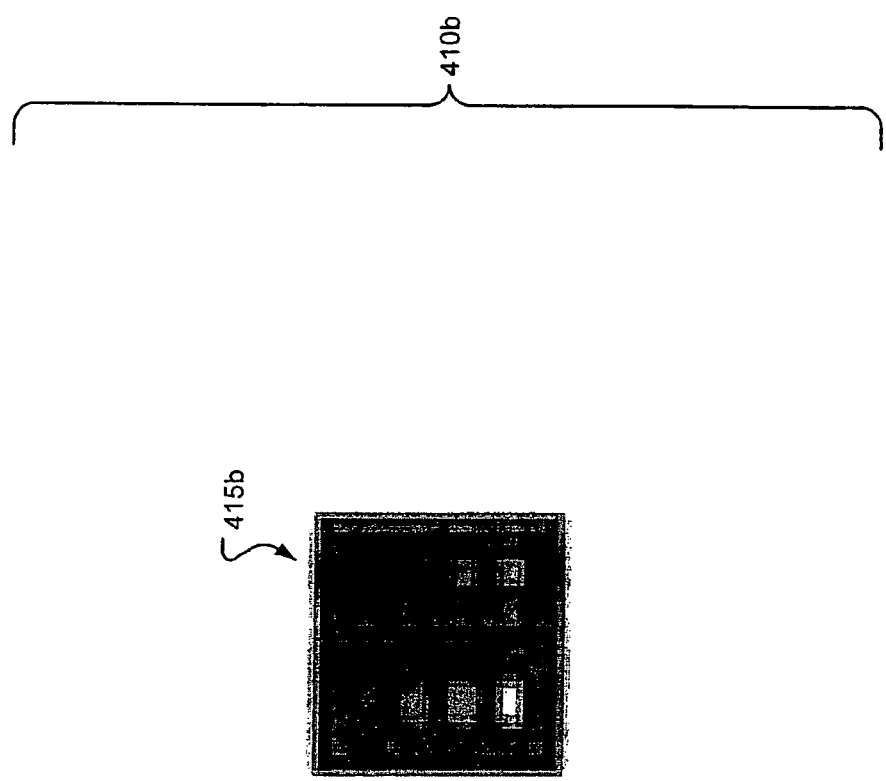
Figure 4C:
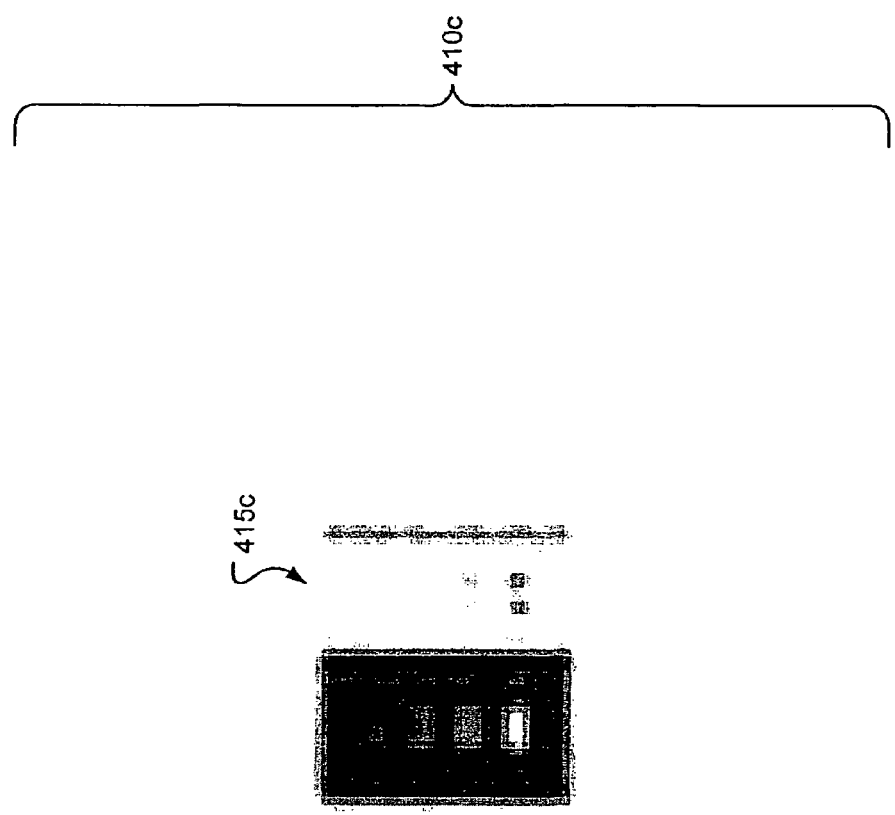
Figure 4D:
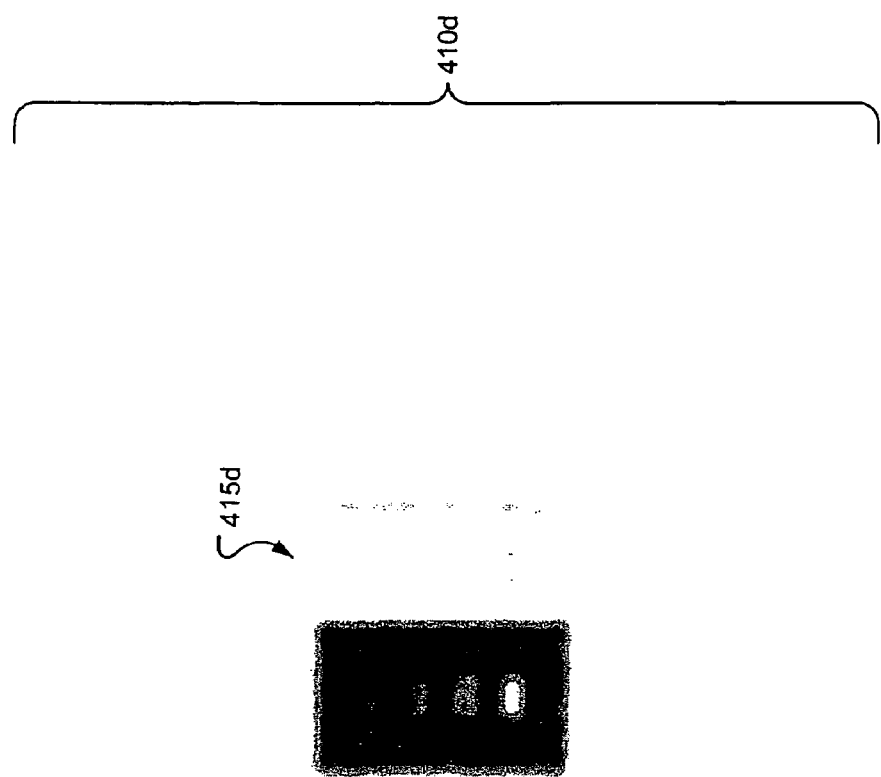
Figure 5A:
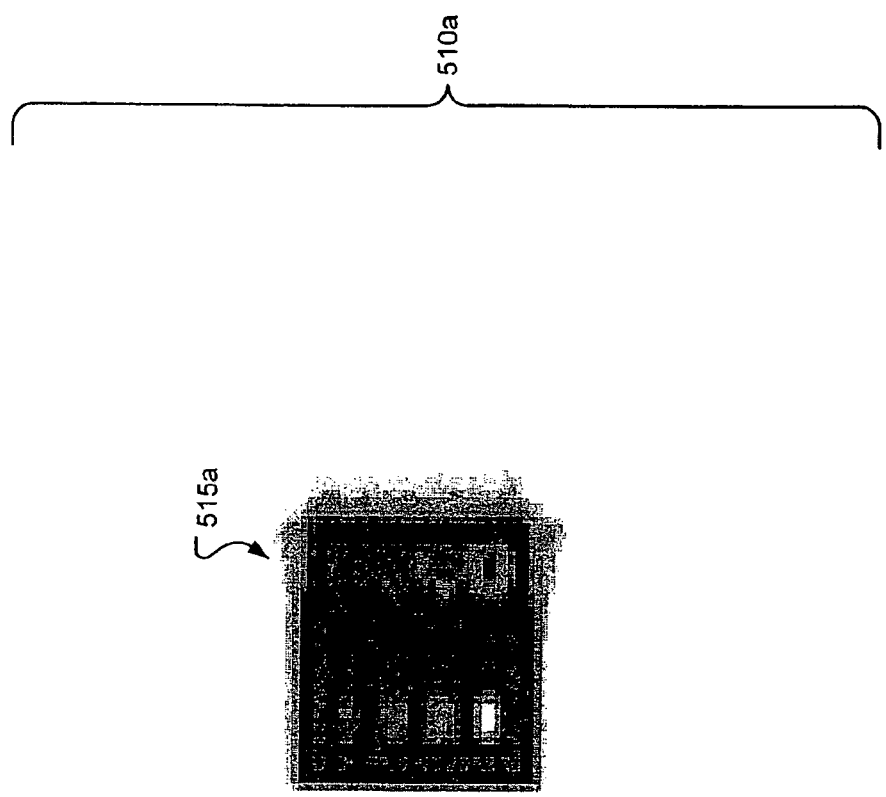
Figure 5B:
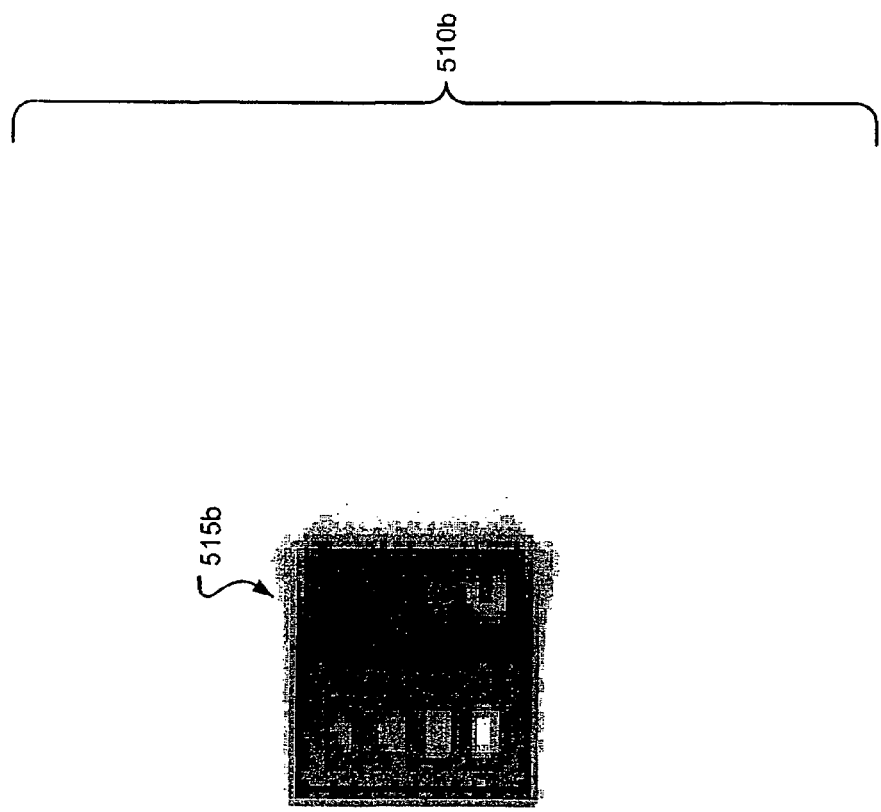
Figure 5C:
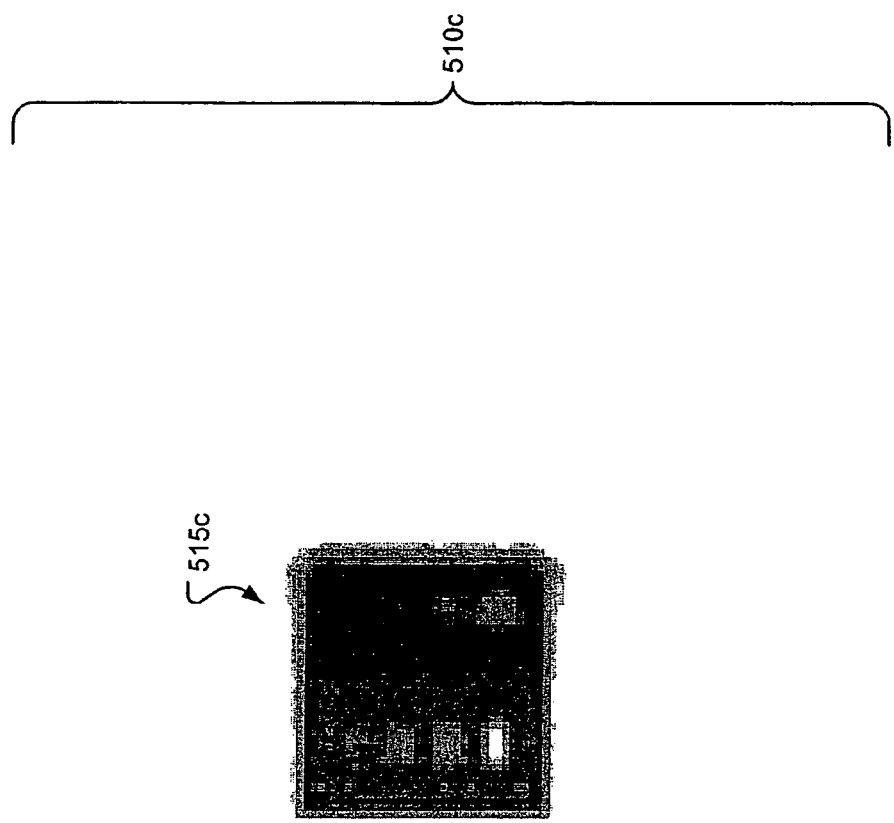
Figure 5E:
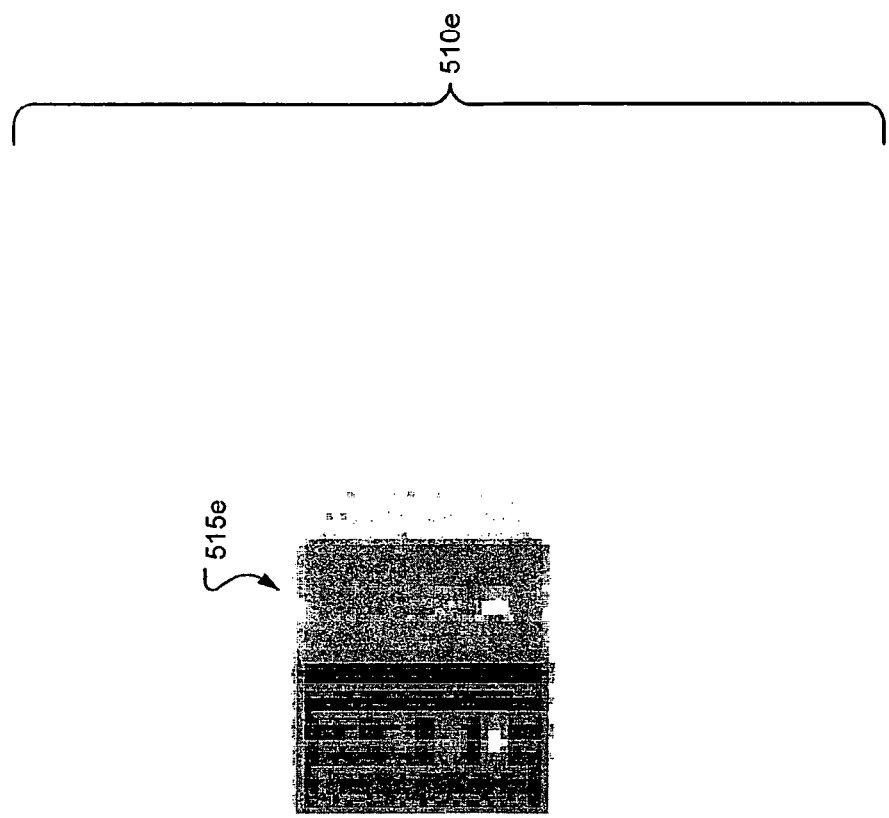
Figure 5F:
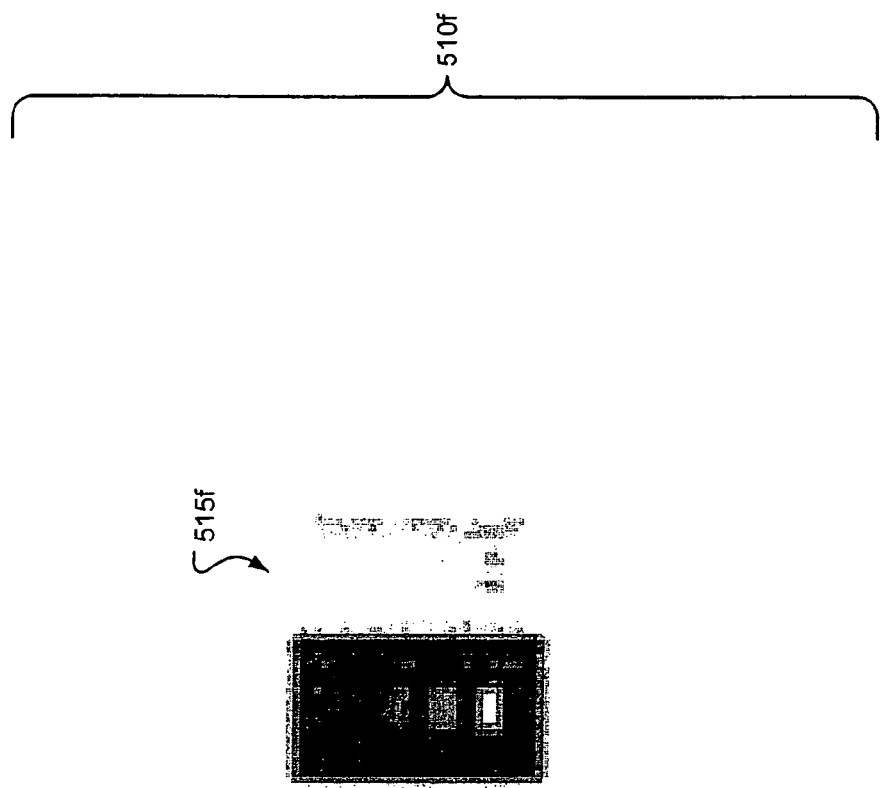

FIGS. 3A through 3C illustrate cross-sections of the computed test phantom distribution. Specifically, FIG. 3A illustrates k,t-space 305; FIG. 3B shows the DFT computed cross-section in (x,$\omega$)-space 320, showing the on-resonance section as a vertical bar 325b, and the background gradient area appearing as an oblique bar 330b at the bottom; and FIG. 3C shows the same cross-section 340 through the x, $\omega$ distribution following fitting and application of the estimation algorithm. It should be noted that, in FIG. 3A, the diverging streaks 310, 315 correspond to the two portions of the phantom. The one 310 along the central time-axis is the on-resonance feature. The one 315 passing obliquely out of the sampled area is the region with background gradient. It should also be noted that, in FIG. 3B, the ghosts 335a . . . 335b (collectively 335) in the background represent aliasing features due to the rosette's undersampling in (k,t), FIG. 3A demonstrates a cross-section 305 of the (k,t)-distribution of the computed test object. The linear feature progressively shifting in $k_x$ (downward in the diagram) as time progresses represents the portion of the computed phantom with a significant background gradient. The multiple image frames of the EPI and spiral acquisitions are shown in FIGS. 4A through 4D and FIGS. 5A through 5F, respectively.

FIGS. 4A through 4D show the four EPI frames 410a . . . 410d (collectively 410), with nominal acquisition times of TE=10.7 ms, 32.1 ms, 53.5 ms, and 74.9 ms, respectively.

FIGS. 5A through 5F show the six spiral frames 510a... 510f (collectively 510) with nominal acquisition times TE=0 ms, 10.6 ms, 21.2 ms, 31.8 ms, 42.4 ms, and 53 ms, respectively.

Note that the later image frames in the multiple-gradient echo series are acquired after most of this feature has exited from the sampled region in k, which occurs between 40 and 45 milliseconds into the signal. Thus, in these later images the right-hand section 415, 515 with significant background gradient is no longer visible. In the EPI frames, the "intensity pileup" effect in the right-hand section 415a... 415d (collectively 415) during the early frames makes it difficult, if not impossible, to perform a satisfactory fit using the first two frames to compute the parameter maps. Similarly, the progressive off-resonance blurring in the early frames of the spiral series 510 makes it difficult, if not impossible, to perform a satisfactory fit in the right-hand section 515a... 515f (collectively 515) of those frames.

The parameterized images $M_{xy0}$, $R_2^*$, and ω produced by SS-PARSE are shown in FIGS. 6A through 6E, demonstrating the lack of off-resonance geometric errors.

Figure 6A:
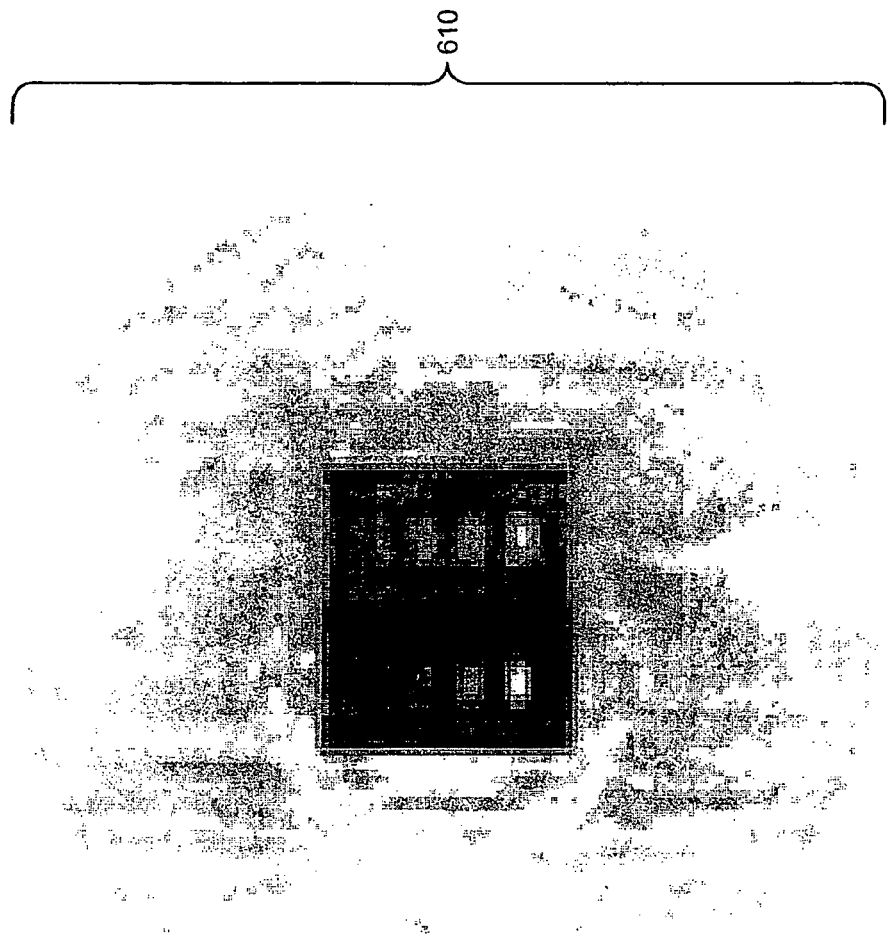
FIG. 6A is an initial guess image formed by computing the local spectrum from each pixel and fitting a Lorentzian in the temporal frequency domain.

The initial rough estimate of $M_{xy0}$ 610, shown in FIG. 6A, is the combined selective-frequency DFT image mentioned above, with aliasing features readily visible outside the phantom rectangle. The effectiveness of the iterative estimation technique in removing the aliasing features is apparent in a comparison of FIGS. 6A and 6B.

Figure 6B:
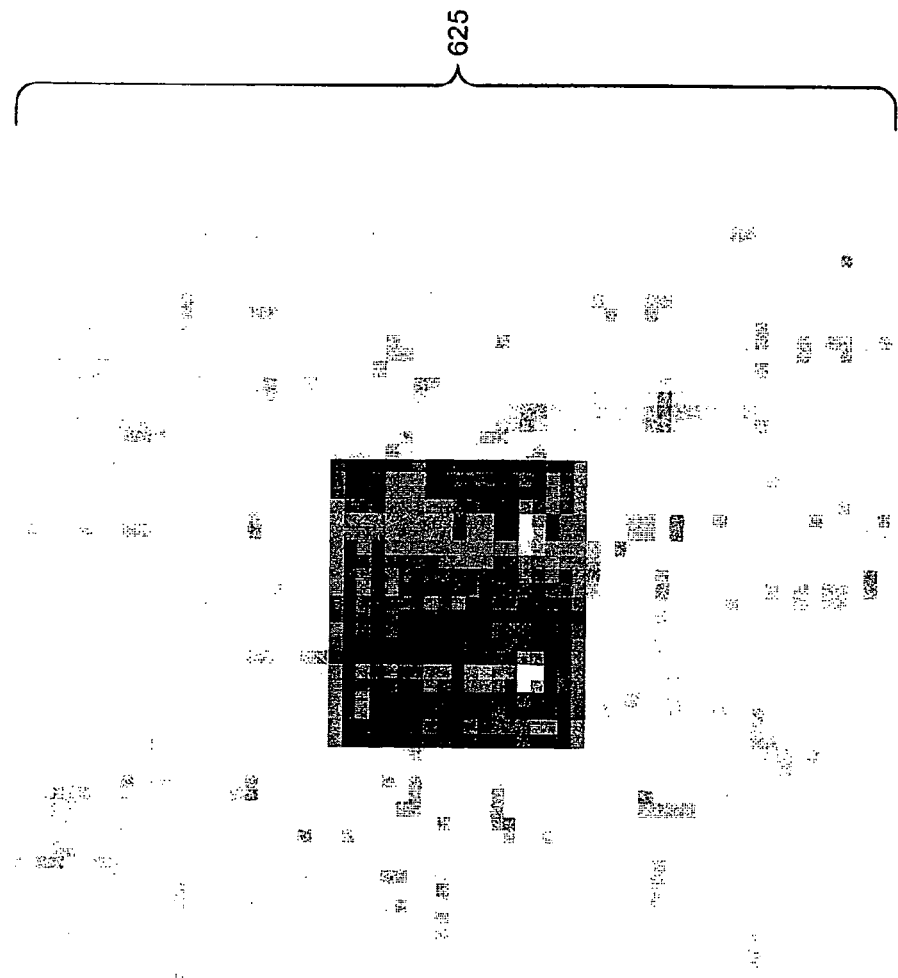
FIG. 6B is a DFT sum image formed by summing over a set of images, each selective for a different frequency.
Figure 6C:
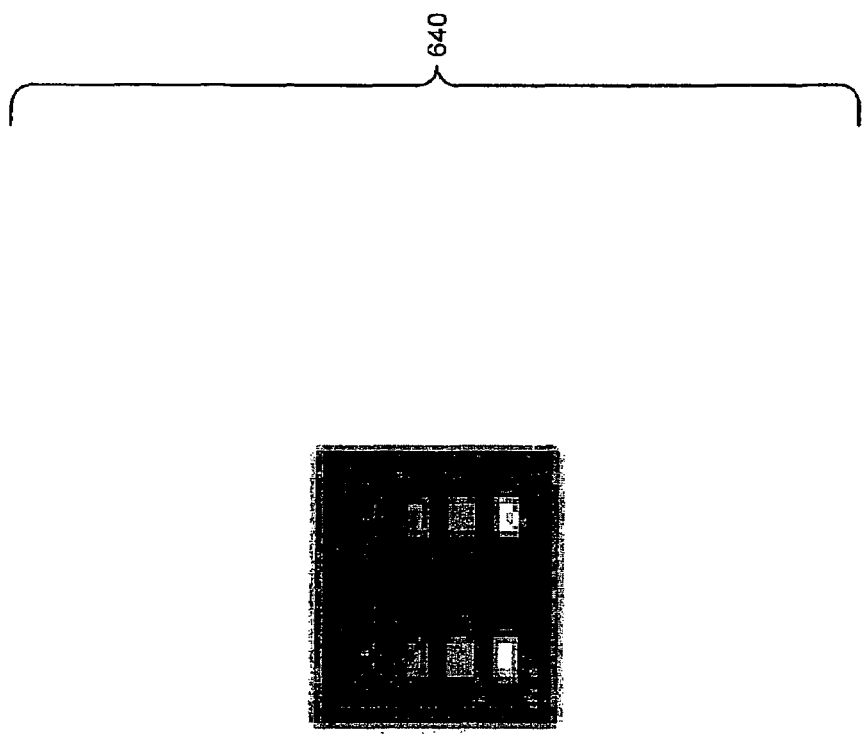
FIG. 6C is an image of an estimate of the magnitude parameter of a parameterized equation, given by an iterative estimation algorithm.
Figure 6D:
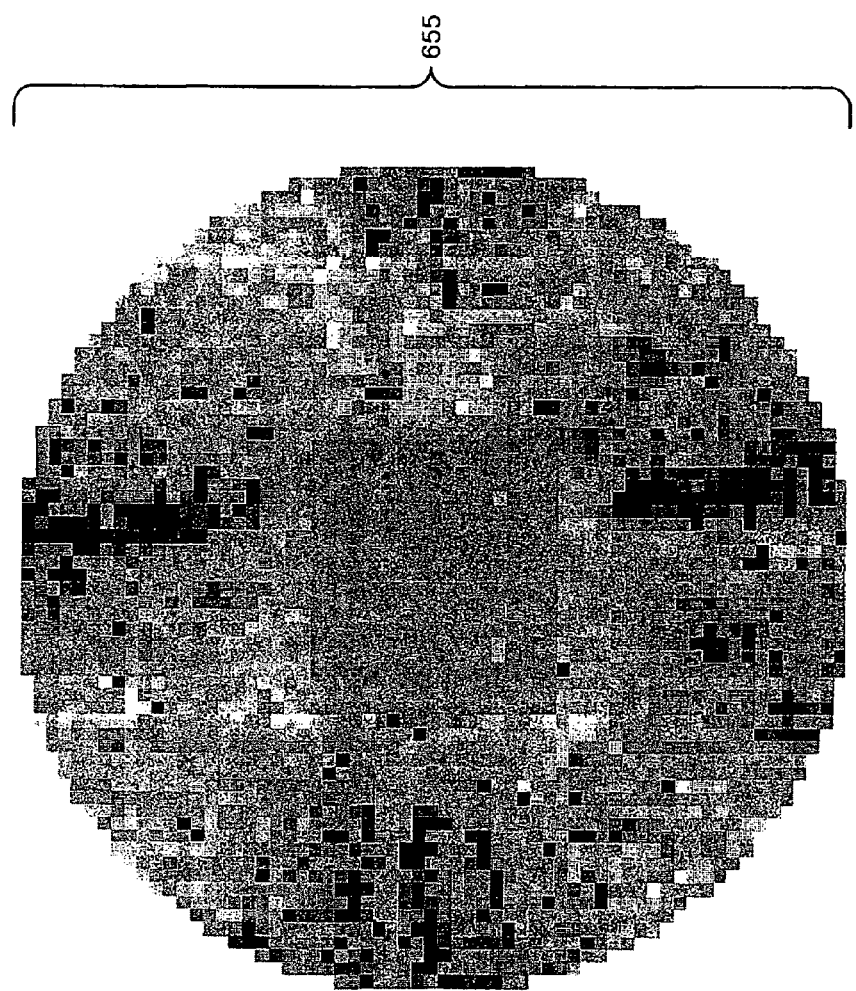
FIG. 6D is an image of an estimate of the relaxation rate of the parameterized equation, given by an iterative estimation algorithm.

FIG. 6B shows the DFT-sum image 625, formed by summing over a set of images, each selective for a different frequency; FIG. 6C shows the estimate of the test phantom magnitude 640 after estimation; FIG. 6D shows the estimate of $R_2^*$ 655; and FIG. 6E shows estimate of frequency 670. In FIGS. 6D and 6E, the background patterns outside the object are meaningless because |$M_{xy0}$| is zero.

FIGS. 7A and 7B show the estimated values of $R_2^*$ and ω in cross-sections through the phantom, demonstrating the accuracy of the estimates. Specifically, FIG. 7A shows the fitted frequencies across several rows of the phantom; and FIG. 7B shows $R_2^*$ estimates for the same locations. The actual $R_2^*$ was 15 sec$^{-1}$. As shown in FIGS. 7A and 7B, the $R_2^*$ estimates were less uniform across the object, but at a given pixel location they were highly repeatable across separate acquisitions, as indicated in FIGS. 8 and 9.

Figure 8:
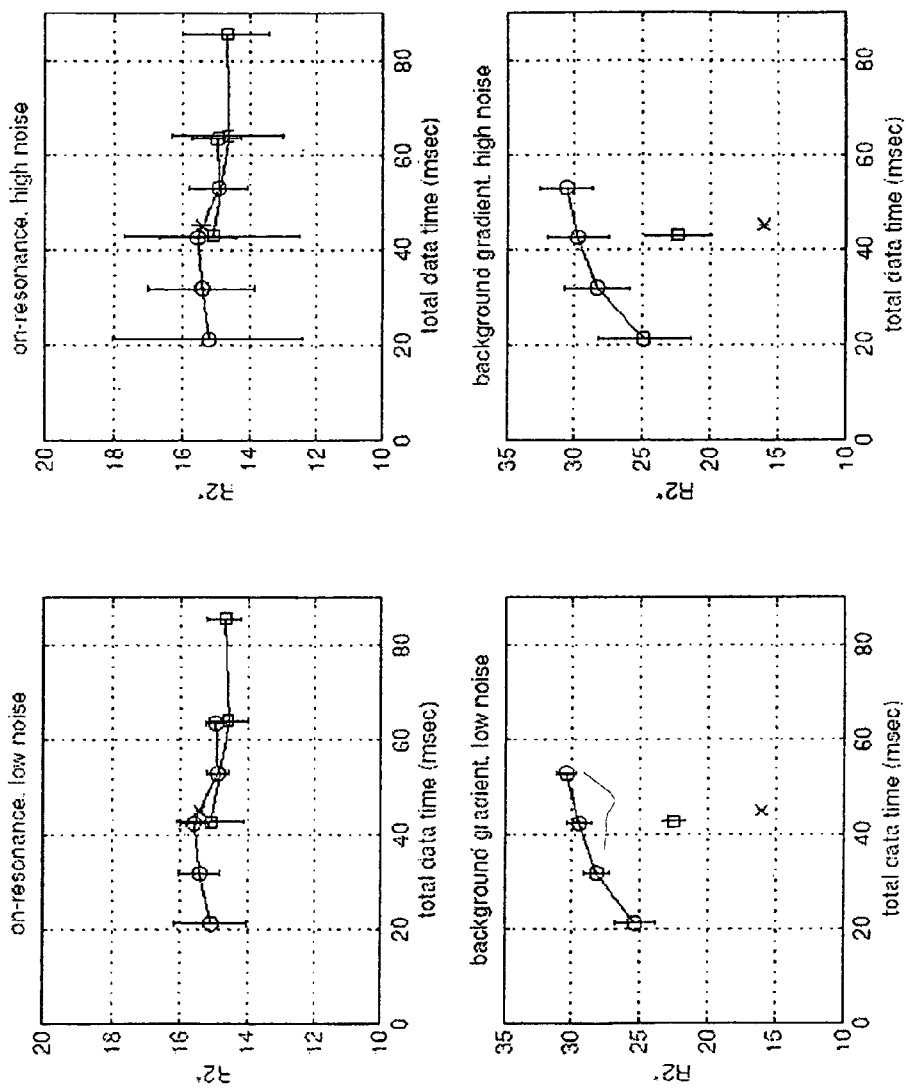
FIG. 8 shows charts of estimates of relaxation rates for various conditions.

FIG. 8 shows the estimates of $R_2^*$ resulting from fitting to MGE data and from SS-PARSE. For on-resonance section, fits were made to 2, 3, 4, 5, and 6 spiral acquisitions (circles), and to 2, 3, and 4 EPI acquisitions (squares). Error bars indicate standard deviations. For section with background gradient, fewer fits were possible (2, 3, and 4 acquisitions for spirals, 2 only for EPI.) Estimates for SS-PARSE are indicated by small x, with error bars indicating standard deviations. Positions of points along abscissa reflect total acquisition time required for the multiple frames used in the fit, and the total data length used in the SS-PARSE estimation.

Figure 9:
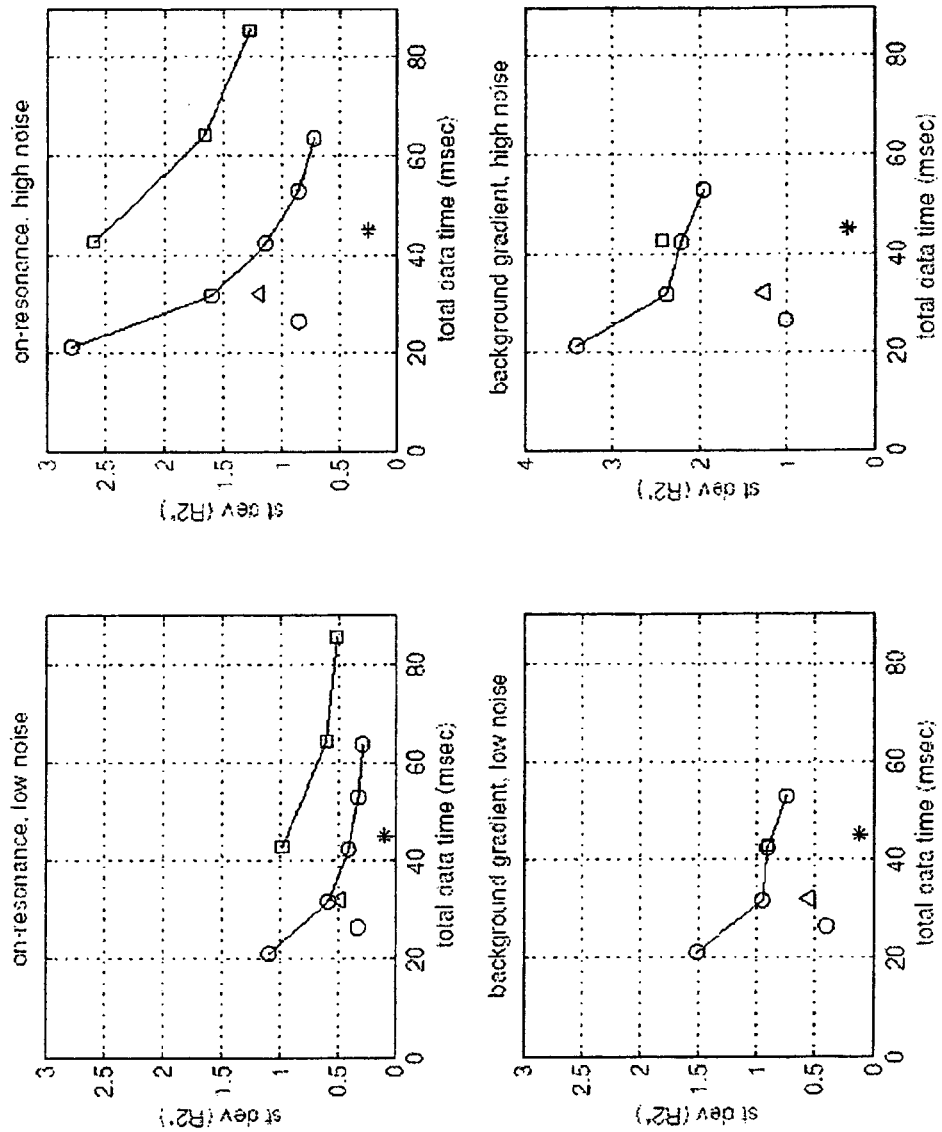
FIG. 9 shows charts of estimates of standard deviations for the various conditions of FIG. 8.

FIG. 9 shows the standard deviations of $R_2^*$ estimates by MGE spirals (connected circles) and MGE EPI (connected squares), with standard deviations of single-frame spirals and EPI acquisitions indicated by isolated circles and triangles respectively. Standard deviations for SS-PARSE are indicated by asterisks.

In these trials, the $R_2^*$ values given by the Lorentzian fit to the local estimated signal were more consistent than the $R_2^*$ estimates given by the iterative estimation procedure, and it is these which are shown in the results. In principle, a more effective search algorithm such as a properly preconditioned conjugate gradient method should be able to improve upon the already very good estimates provided by the initial Lorentzian fit.

Computation times were typically 120 to 140 minutes per image using MATLAB (MathWorks, Natick, Mass.) script for the complete fitting and estimation process on a 450 MHz Macintosh G4 computer. However, with further development, greatly increased speeds are expected. In an fMRI series, the image frames are virtually identical except for the small activation-associated changes. Thus, in practice, a completely estimated first image frame would serve as a very good starting value for computation of the subsequent images in the series, and permit a much more rapid estimation of subsequent images.

The performance of the MGE methods and SS-PARSE in estimating local $R_2^*$ is summarized in FIGS. 8 and 9, as indicated above. Estimates of $R_2^*$ in the on-resonance phantom section showed little bias, but different levels of variability. As expected, $R_2^*$ estimates from fitting multiple-echo images showed decreased variability as the number of image frames used in the fit increased. In the low-noise case, the standard deviations for fits to multiple spirals were somewhat better (0.3 for a fit to all six frames) then fits to multiple EPI frames (0.5 for fits to all 4 frames). SS-PARSE $R_2^*$ estimates had standard deviations lower than those of the MGE estimates (for low noise and on-resonance, 0.249 for SS-PARSE and 0.295 for six-frame spiral MGE fit), representing substantially increased accuracy. $R_2^*$ estimates in the background gradient section of the phantom showed large biases for the MGE methods, likely due to the spatial intensity variations caused by geometric distortion and blurring. In the high-noise case, standard deviations of the estimates were larger in all cases, but the relative performance of the methods remained the same.

Though single-echo acquisitions cannot provide $R_2^*$ estimates directly, it is of interest to compare their variability with the variability of the $R_2^*$ estimates of the other methods, because serial changes in single-echo image intensity are taken as indicators of serial changes in $R_2^*$ in the majority of contemporary blood oxygenation level dependent (BOLD) fMRI studies. The standard deviation of $R_2^*$ computed from the second EPI frames only, and similarly from the third spiral frame only (assuming a constant initial amplitude $M_{xy0}$ and a mean $R_2^*$ of 15 sec$^{-1}$), was plotted in FIG. 9 as a triangle and a circle, respectively. It is worthwhile to note that the apparent variability of the $R_2^*$ inferred from these conventional single-frame acquisitions is about the same as the variability of the $R_2^*$ estimate from the fit over all multiple-echo frames. In practice, of course, the single-frame variability is subject to additional sources of noise (fluctuations in apparent $M_{xy0}$), to which the multiple-echo fitted estimate and the SS-PARSE estimate are relatively insensitive.

Because SS-PARSE parses information in k,t-space from each datum individually, that technique is expected to offer fundamentally improved performance in several respects. First, it is expected to be robust against off-resonance geometric errors, because it abandons the assumption that all signal phase changes correspond to phase changes in the object's k-space content along the k-trajectory. Instead, they may also correspond to phase changes along the t-axis of the object's (k,t)-distribution. Second, SS-PARSE may be able to more sensitively measure local frequencies and decay rates, because it parses each datum of the signal, rather than assuming that data are grouped in sets (i.e., one gradient echo image, or a group of gradient echo images), each with a single acquisition time in common. The results of the simulation studies reported here support both of these expectations. Given identical system constraints and noise conditions, the standard deviations of $R_2^*$ estimates by SS-PARSE were less than one-fourth that of $R_2^*$ estimates by MGE EPI and spiral acquisitions. In the phantom section with a background frequency gradient, the EPI and spiral acquisitions produced geometric errors which prevented meaningful fits for $R_2^*$, while the SS-PARSE estimates were almost as accurate in the background gradient section as they were in the on-resonance section. There were no discernible geometric errors in the SS-PARSE $M_{xy0}$, frequency, or $R_2^*$ maps in the section with background gradient. In sensitivity to $R_2^*$ variations, the single-echo EPI and spiral methods performed about as well as the multiple-echo versions with fitting, but the single-echo versions cannot distinguish between $R_2^*$ variations and $M_{xy0}$ variations, making them more vulnerable to variations from sources other than the BOLD mechanism. The SS-PARSE $R_2^*$ estimates had significantly lower variance than the estimates by fitted MGE. The lower variance may be due to the intrinsic properties of the different k,t sampling patterns used (e.g., the concentration of rosette samples near the k-space origin, where the signal level is greater).

Alternatively, the lower variance may be due to the fact that the SS-PARSE temporal samples are taken continuously in time and analyzed continuously, while the MGE samples are taken continuously in time but analyzed as though they were acquired in simultaneous groups at discrete times $TE_n$. Another explanation for the lower variance may be poorer performance of the exponential fit compared to the Lorentzian fit to the local spectrum. A series of two-dimensional simulations, not described herein, implicate the latter cause.

SS-PARSE appears to be quite robust against susceptibility gradients in the in-plane direction. However, susceptibility gradients in the slice direction can also be problematic, leading to image intensity dropouts, which prevent fMRI studies of inferior portions of the brain. Z-shimming methods can be applied to reduce or eliminate these intensity dropouts, but most require multiple acquisitions. It appears that SS-PARSE could be adapted in at least two ways to deal with through-slice dephasing. First, SS-PARSE could be extended to include different levels of z-shimming within the single signal. Alternatively, SS-PARSE could be applied with a model acknowledging altered signal decay shapes characteristic of through-slice dephasing.

The lengthy computation times for the prototype SS-PARSE reconstruction method complicate the investigation at this early stage, but there are prospects for faster reconstructions. First, the present algorithm could be made more efficient by simply increasing the memory available for handling large arrays, by implementing it in the C language rather than in MATLAB script, and by using a faster processor or a multiple-processor array. More efficient linearized closed-form algorithms may be possible. Whatever algorithm is used, the power of affordable workstations and higher-level personal computers continues to increase at a rapid rate; computations requiring supercomputers a decade ago are now routinely performed on personal computers. We expect development of increased computational power and improved algorithms for SS-PARSE will bring computation times down to the range of tens of seconds in the near future. Such times are practical in the context of current fMRI practice, which often involves overnight off-line data processing.

The results of this study suggest that SS-PARSE has significant potential advantages as a functional MRI acquisition method. For example, first, similar to existing multiple-echo single-shot techniques, SS-PARSE can form images of initial magnetization amplitude, net relaxation rate $R_2^*$, and local frequency, thereby allowing observation of serial changes in $R_2^*$ uncontaminated by amplitude fluctuations unrelated to BOLD functional effects. Second, unlike the multiple-echo methods, SS-PARSE images are not subject to off-resonance geometric errors, which can seriously compromise attempts to accurately co-register functional images with anatomic reference images. Third, SS-PARSE can produce useful images and more accurate estimates of local $R_2^*$ (and possibly $R_2$) changes, even in the presence of background gradients sufficiently large to render such measurements impossible by established multiple-echo methods. Fourth, SS-PARSE offers the flexibility to estimate, from single-shot data, parameters that describe non-exponential local relaxation and local frequency changes during the signal acquisition.

Non-exponential gradient echo decay is to be expected in the case of through-slice dephasing, in which a linear gradient across the slice induces a signal amplitude envelope reflecting the Fourier Transform of the slice profile. Non-exponential gradient echo decay is also expected when multiple tissue types with different $T_2^*$ are present in the same voxel. Also, non-exponential gradient echo decay can be expected, under some circumstances, as a result of the BOLD effect in combination with local vascular geometry. In principle, accounting explicitly for such non-exponential decay effects should yield more accurate parenchymal $R_2^*$ or $R_2$ estimates in affected locations, and may supply additional information useful in its own right.

Recent results suggest that it may be possible to observe frequency changes and dephasing effects in the local NMR signal directly due to neuronal currents during activation. The ability of SS-PARSE to accurately measure local frequency, or even frequency changes, during the single-shot signal may prove useful in investigating these phenomena.

The application of PARSE examined here is a single-shot technique designed to estimate only temporal signal evolution characteristics. In principle, the PARSE approach can also be applied to multiple-signal experiments, 3-D volume experiments, and steady-state sequences. As mentioned above, the PARSE approach, in general, may be applied to rapid and efficient encoding of a number of different parameters of interest, including diffusion tensors, velocity, and (given appropriate pulse sequences) substantially simultaneous and efficient measurement of the longitudinal relaxation rate $R_1$ and spin-spin transverse relaxation rate $R_2$. In that regard, any number of user-defined variables may be analyzed using the parameterized approach outlined above.

In principle, because PARSE applies a more accurate model of the acquisition process, the PARSE approach allows observation of the temporal dynamics of local signals with greater flexibility and accuracy, and under a wider range of off-resonance and susceptibility gradient conditions than are tolerated by established MRI methods.

PARSE has the ability to encode and extract information more effectively from the signal than the currently used techniques, which include in their reconstruction approximations dictated by computational convenience. PARSE techniques in general, which can more fully utilize the information-gathering capabilities of the MRI acquisition process at the cost of increased computational burden, promise improved performance.

Figure 11:
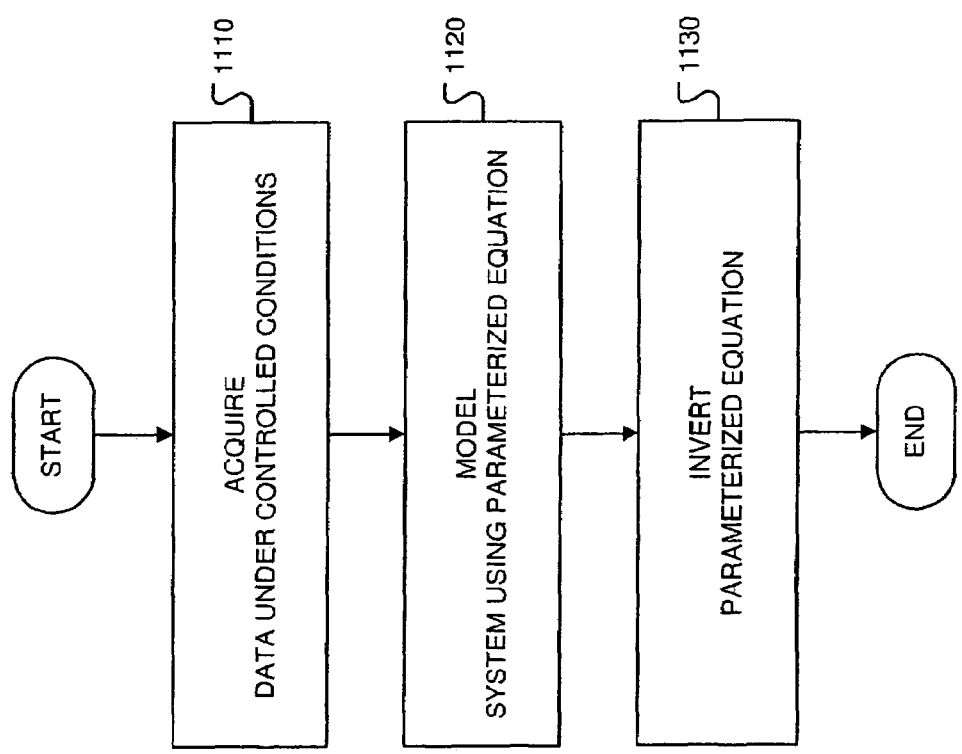
FIG. 11 is a flowchart showing an embodiment of a process for analyzing data using a parameterized approach.

Having specifically described the PARSE technique and, more specifically, the SS-PARSE technique, attention is turned to FIG. 11, which shows a flowchart of a more general embodiment in which sample properties are estimated using a parameterized approach. As shown in FIG. 11, some embodiments of the process begin by acquiring (1110) data under controlled conditions. The data is acquired from a particular subject or system under study, such as, for example, a phantom, in vivo human brain, or other tissue. As discussed above, in some embodiments, the data acquisition occurs in the context of NMR. Hence, some systems include an NMR-observable sample. In the context of NMR, specific embodiments of the process collect data using a periodic k-space trajectory, such as, for example, a rosette trajectory, which is known to those having skill in the art. For some embodiments, the acquired data from the NMR-observable sample are fMRI data.

As shown in FIG. 11, some embodiments of the process also include the step of modeling (1120) the system or subject using a parameterized equation. The parameterized equation provides an indication of the properties of the system or subject. As noted above, the parameterized equation, in the context of NMR, can be the Bloch equations, or various modifications of the Bloch equations, which characterize the behavior of spins for NMR-observable samples. Specifically, in some embodiments, the specific parameterized equation can appear similar to Eq. 6, above. It should be appreciated that, while Eq. 6 provides parameters associated with spin density, relaxation rate, and spatial phase modulation imposed by gradient magnetic fields, other embodiments can include different parameters to estimate other NMR-observable properties of the sample. These other parameters can include frequency, apparent diffusion coefficient or other measures of directional diffusion rates, velocity or acceleration, other time-dependent or time-independent variables that are amenable to NMR, or any combination of these parameters.

Upon acquiring (1110) the data, the data is analyzed by inverting (1130) the parameterized equation. The inverted parameterized equation provides an estimate of the parameters under consideration. For example, if the parameterized equation includes a phase modulation parameter and a relaxation rate parameter, then the inversion of the parameterized equation provides an estimate of both the phase modulation and the relaxation rate. Similarly, if the parameterized equation includes a spin density parameter and a frequency parameter, then the inversion of the parameterized equation provides an estimate of both the spin density and the frequency. It should be appreciated that any combination of a number of different parameters may be modeled in an appropriate parameterized equation. In some embodiments, the inverting (1130) of the parameterized equation is an iterative approach that converges to an appropriate solution. As noted above, the iterative approach can include a least-squares algorithm that converges to the solution. It should be appreciated, however, that any iterative convergent algorithm can be used to estimate the relevant parameters.

As described above, the inversion of the parameterized equation provides an improved approach to estimating properties of samples or subjects. While the inversion of the parameterized equation may be a greater computational burden than conventional approaches, it is expected that rapid increases in computational power will result in increased efficiency in the parameterized approach.

Any process descriptions or blocks in flowcharts should be understood as representing modules, segments, or portions of code which include one or more executable instructions for implementing specific logical functions or steps in the process, and alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art.

It should be appreciated that the least-squares algorithm and other corresponding code for implementing PARSE, SS-PARSE, and other parameterized computations can be implemented in a computer program. The program, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured via, for instance, optical scanning of the paper or other medium, then compiled, interpreted or otherwise processed in a suitable manner if necessary, and then stored in a computer memory.

The least-squares algorithm and other corresponding code for implementing PARSE, SS-PARSE, and other parameterized computations can be implemented in hardware, software, firmware, or a combination thereof. In the preferred embodiment(s), the least-squares algorithm and other corresponding code for implementing PARSE, SS-PARSE, and other parameterized computations can be implemented in a computer program are implemented in software or firmware that is stored in a memory and that is executed by a suitable instruction execution system. If implemented in hardware, as in an alternative embodiment, the least-squares algorithm and other corresponding code for implementing PARSE, SS-PARSE, and other parameterized computations can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Although exemplary embodiments have been shown and described, it will be clear to those of ordinary skill in the art that a number of changes, modifications, or alterations to the invention as described may be made. For example, while example embodiments are described in the context of fMRI, it should be appreciated that similar approaches may improve estimation of sample properties for other MRI experiments, such as, for example, diffusion tensor imaging (DTI) and high angular resolution diffusion (HARD) imaging, among others. More generally, while the various embodiments teach exemplary systems and methods in the context of NMR or MRI, it should be appreciated that the systems and methods may be applicable to other imaging environments and, more generally, other data acquisition environments.

Furthermore, while PARSE and SS-PARSE have been specifically described above as example embodiments, it should be appreciated that the parameterized approach described above need not be specifically limited to the disclosed embodiments.

Also, while a least-squares algorithm is provided as an example iterative estimation approach, it should be appreciated that other algorithms, such as, for example, a maximum-likelihood algorithm, may be used to during the data analysis.

Additionally, while data-acquisition systems for acquiring NMR data has not explicitly been shown, it should be appreciated by one having skill in the art that NMR data can be acquired using conventional NMR scanners. Similarly, it should be appreciated that magnetic resonance images (MRIs) and functional MRIs can be obtained using known MRI scanners that are configured for magnetic resonance imaging can be used to obtain the MRI data and the fMRI data. Since such scanners are known to those having skill in the art, further discussion of those scanners is omitted here.

All applicable changes, modifications, and alterations should therefore be seen as being within the scope of the disclosure.

What is claimed is:

1. A method for estimating nuclear magnetic resonance (NMR) properties of NMR-observable samples, the method comprising the steps of:
   acquiring NMR data using a rosette k-space trajectory, the NMR data being acquired under controlled conditions;
   modeling a behavior of an NMR-observable sample using a parameterized equation $S_n$ that parameterizes the complete equation, the parameterized equation being:

$$s_n = \sum_q \sum_r M_{xy0}(q, r) g(q, r)^n \psi_n(q, r),$$

the $M_{xy0}(q,r)$ parameter corresponding to a spin density of the NMR-observable sample, the $g(q,r)$ parameter corresponding to a relaxation rate of the NMR-observable sample, the $g(q,r)$ parameter further corresponding to frequency of the NMR-observable sample, the $\psi_n(q,r)$ corresponding to a known spatial phase modulation imposed by gradient magnetic fields, the n parameter corresponding to the nth observed sample; and
   inverting the entire parameterized equation using the acquired NMR data, the inverted parameterized equation providing an estimate of $M_{xy0}(q,r)$ and $g(q,r)$.

2. The method of claim 1, wherein the step of inverting the parameterized equation further comprises the step of performing a least-squares algorithm on the acquired data using the parameterized equation.

3. A method of analyzing magnetic resonance data, the method comprising the steps of:
   modeling each datum in a set of data, each datum being modeled using a single parameterized equation, the set of data being obtained from a nuclear magnetic resonance (NMR)-observable sample, the single parameterized equation having multiple parameters, each parameter representing a property of the NMR-observable sample;
   acquiring the data under controlled conditions using a rosette k-space trajectory; and
   inverting the entire parameterized equation, the inverted parameterized equation providing an estimate of each of the multiple parameterized parameters.

4. The method of claim 3, wherein the parameterized equation is:

$$s_n = \sum_q \sum_r M_{xy0}(q, r) g(q, r)^n \psi_n(q, r),$$

the $M_{xy0}(q,r)$ parameter corresponding to a spin density of the NMR-observable sample, the $g(q,r)$ parameter corresponding to a relaxation rate of the NMR-observable sample, the $g(q,r)$ parameter further corresponding to a frequency of the NMR-observable sample, the n parameter corresponding to the nth observed sample, and the $\psi_n(q,r)$ corresponding to a known spatial phase modulation imposed by gradient magnetic fields.

5. The method of claim 3, wherein the step of modeling each datum comprises the step of providing a modified Bloch equation, the modified Bloch equation having variables, each variable corresponding to a nuclear-magnetic resonance (NMR)-observable property of the sample.

6. The method of claim 3, wherein the step of modeling each datum comprises the step of providing a parameterized equation having a parameter corresponding to a spin density of the sample.

7. The method of claim 3, wherein the step of modeling each datum comprises the step of providing a parameterized equation having a parameter corresponding to a relaxation rate of the sample.

8. The method of claim 3, wherein the step of modeling each datum comprises the step of providing a parameterized equation having a parameter corresponding to a frequency.

9. The method of claim 3, wherein the step of modeling each datum comprises the step of providing a parameterized equation having a parameter corresponding to a spatial phase modulation imposed by gradient magnetic fields.

10. The method of claim 9, wherein the spatial phase modulation imposed by gradient magnetic fields is a time-dependent spatial phase modulation.

11. The method of claim 3, wherein the step of modeling each datum comprises the step of providing a parameterized equation having a parameter corresponding to an apparent diffusion coefficient.

12. The method of claim 3, wherein the step of modeling each datum comprises the step of providing a parameterized equation having a parameter corresponding to a measure of directional diffusion rate.

13. The method of claim 3, wherein the step of modeling each datum comprises the step of providing a parameterized equation having a parameter corresponding to a velocity component.

14. The method of claim 3, wherein the step of modeling each datum comprises the step of providing a parameterized equation having a parameter corresponding to an nth order motion component, wherein n is an integer value.

15. The method of claim 3, wherein the step of modeling each datum comprises the step of providing a parameterized equation having a parameter corresponding to an acceleration component.

16. The method of claim 3, wherein the step of acquiring the data under controlled conditions comprises the step of acquiring data using a periodic rosette k-space trajectory.

17. A system comprising:
   means for acquiring data from a nuclear magnetic resonance (NMR)-observable sample under controlled conditions using a rosette k-space trajectory; and
   a processor configured to analyze each datum in the acquired data, each datum being analyzed using a single parameterized equation, the single parameterized equation being indicative of multiple parameterized properties associated with the NMR-observable sample, the processor further being configured to invert the entire parameterized equation, the inverted parameterized equation providing an estimate of each of the parameterized properties associated with the NMR-observable sample.

18. A system comprising:

a scanner configured to acquire data from a nuclear magnetic resonance (NMR)-observable sample under controlled conditions using a rosette k-space trajectory; and a processor configured to analyze each datum in the acquired data, each datum being analyzed using a single parameterized equation, the single parameterized equation being indicative of multiple parameterized properties associated with the NMR-observable sample, the processor further being configured to invert the entire parameterized equation, the inverted parameterized equation providing an estimate of each of the parameterized properties associated with the NMR-observable sample.

19. The system of claim 18, wherein the scanner is a nuclear magnetic resonance (NMR) scanner.

20. The system of claim 19, wherein the parameterized properties comprise at least one selected from the group consisting of:

a spin density;

a relaxation rate;

a frequency;

an apparent diffusion coefficient a directional diffusion rate;

a velocity component;

an acceleration component; and an nth order motion component, where n is an integer.

21. The system of claim 19, wherein the scanner is further configured to acquire magnetic resonance imaging (MRI) data.

22. The system of claim 21, wherein the scanner is further configured to acquire functional magnetic resonance imaging (fMRI) data.

* * * * *